United States Patent
Ozawa et al.

(10) Patent No.: US 9,281,781 B2
(45) Date of Patent: Mar. 8, 2016

(54) SEMICONDUCTOR APPARATUS, OSCILLATION CIRCUIT, AND SIGNAL PROCESSING SYSTEM

(71) Applicant: RENESAS ELECTRONICS CORPORATION, Kanagawa (JP)

(72) Inventors: Osamu Ozawa, Kanagawa (JP); Soshiro Nishioka, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/248,658

(22) Filed: Apr. 9, 2014

(65) Prior Publication Data

US 2014/0320223 A1   Oct. 30, 2014

(30) Foreign Application Priority Data

Apr. 24, 2013   (JP) .................. 2013-091368

(51) Int. Cl.
H03B 5/36   (2006.01)
(52) U.S. Cl.
CPC ............... *H03B 5/364* (2013.01); *H03B 5/366* (2013.01); *H03B 2200/0082* (2013.01); *H03B 2200/0094* (2013.01); *H03B 2201/0266* (2013.01)
(58) Field of Classification Search
CPC ............ H03B 5/366; H03B 5/36; H03B 5/32; H03B 2200/005; H03B 2201/025; H03B 2201/03; H03B 2201/026

USPC ............. 331/116 R, 116 FE, 158, 177 V, 179
See application file for complete search history.

(56) References Cited

U.S. PATENT DOCUMENTS

| | | | |
|---|---|---|---|
| 6,346,862 B2* | 2/2002 | Hasegawa et al. | 331/158 |
| 6,559,730 B1* | 5/2003 | Marvin et al. | 331/158 |
| 7,639,092 B2* | 12/2009 | Shen et al. | 331/36 C |
| 7,880,553 B2* | 2/2011 | Kikuchi et al. | 331/176 |
| 2008/0136541 A1* | 6/2008 | Yoshinaga | 331/116 FE |

FOREIGN PATENT DOCUMENTS

| | | |
|---|---|---|
| JP | 01-317004 A | 12/1989 |
| JP | 2006-287765 A | 10/2006 |

* cited by examiner

*Primary Examiner* — Ryan Johnson
(74) *Attorney, Agent, or Firm* — Mattingly & Malur, PC

(57) ABSTRACT

A semiconductor apparatus includes: first and second external terminals that are connected to respective both ends of an piezoelectric vibrator, in which the piezoelectric vibrator is externally disposed; an inverting amplifier that is disposed between the first and second external terminals; a feedback resistance that feeds back an output of the inverting amplifier to an input of the inverting amplifier; a first capacitative element that is disposed between the first external terminal and a reference voltage terminal; a first resistive element that is disposed in series with the first capacitative element; a second capacitative element that is disposed between the second external terminal and the reference voltage terminal; and a second resistive element that is disposed in series with the second capacitative element.

19 Claims, 24 Drawing Sheets

SEMICONDUCTOR APPARATUS, OSCILLATION CIRCUIT, AND SIGNAL PROCESSING SYSTEM

CROSS-REFERENCE TO RELATED APPLICATIONS

This application is based upon and claims the benefit of priority from Japanese patent application No. 2013-091368, filed on Apr. 24, 2013, the disclosure of which is incorporated herein in its entirety by reference.

BACKGROUND

The present invention relates to a semiconductor apparatus, an oscillation circuit, and a signal processing system.

There are various kinds of crystal resonators with different oscillation frequencies and load capacitance values. In an oscillation circuit composed of a crystal resonator and a semiconductor chip, the semiconductor chip has heretofore been peculiarly designed according to an oscillation frequency and a load capacitance value of the crystal resonator. Therefore, the semiconductor chip in the oscillation circuit could not generate an oscillation signal using a crystal resonator different from the originally provided one.

A related technique is disclosed in Japanese Unexamined Patent Application Publication No. H01-317004 and Japanese Unexamined Patent Application Publication No. 2006-287765.

Japanese Unexamined Patent Application Publication No. H01-317004 discloses the oscillation circuit including the switched capacitor circuit that is configured to include a plurality of series circuits that are composed of capacitances and switches and at least one of series circuits that are composed of capacitances, resistances, and switches, in which the plurality of series circuits that are composed of capacitances and switches and at least one of the switches that are composed of capacitances, resistances, and switches are connected in parallel with each other. With such a configuration, the oscillation circuit can compensate temperatures with high accuracy.

Japanese Unexamined Patent Application Publication No. 2006-287765 discloses the crystal resonator including the inverter that is capable of changing the size of the inverter.

SUMMARY

As the aim of the digital temperature compensated crystal oscillation circuit disclosed in Japanese Unexamined Patent Application Publication No. H01-317004 is to compensate temperatures, the switched capacitor circuit is disposed on only one side of the crystal resonator. Therefore, in the digital temperature compensated crystal oscillation circuit disclosed in Japanese Unexamined Patent Application Publication No. H01-317004, when the crystal resonator is replaced by another one with an oscillation frequency different from that of the former one, it is difficult to keep the oscillation frequency and a negative resistance (oscillation allowance) within a standard range. That is, there has been a problem in the chip of the digital temperature compensated crystal oscillation circuit disclosed in Japanese Unexamined Patent Application Publication No. H01-317004 that the chip is unable to easily generate an oscillation signal using various crystal resonators with different characteristics.

The crystal oscillation circuit disclosed in Japanese Unexamined Patent Application Publication No. 2006-287765 is unable to adjust a load capacitance on the crystal resonator. Therefore, in the crystal oscillation circuit disclosed in Japanese Unexamined Patent Application Publication No. 2006-287765, when the crystal resonator is replaced by a crystal resonator with an oscillation frequency different from that of the former one, it is difficult to keep the oscillation frequency and the negative resistance (oscillation allowance) within a standard range. That is, there has been a problem in the chip of the crystal oscillation circuit disclosed in Japanese Unexamined Patent Application Publication No. 2006-287765 that the chip is unable to easily generate an oscillation signal using various crystal resonators with different characteristics.

Other problems and new features will be apparent from the description of the specification of the present invention and the attached drawings.

According to one embodiment of the present invention, a semiconductor apparatus includes: first and second external terminals that are connected to respective both ends of an piezoelectric vibrator, in which the piezoelectric vibrator is externally disposed; an inverting amplifier that is disposed between the first and second external terminals; a feedback resistance that feeds back an output of the inverting amplifier to an input of the inverting amplifier; a first capacitative element that is disposed between the first external terminal and a reference voltage terminal; a first resistive element that is disposed in series with the first capacitative element; a second capacitative element that is disposed between the second external terminal and the reference voltage terminal; and a second resistive element that is disposed in series with the second capacitative element.

According to another embodiment of the present invention, the semiconductor apparatus includes: first and second external terminals that are connected to respective both ends of an piezoelectric vibrator, in which the piezoelectric vibrator is externally disposed; an inverting amplifier that is disposed between the first and second external terminals; a feedback resistance that feeds back an output of the inverting amplifier to an input of the inverting amplifier; a first capacitative element that is disposed between the first external terminal and a reference voltage terminal; and a second capacitative element that is disposed between the second external terminal and the reference voltage terminal. The inverting amplifier includes: an input differential pair; a constant current source circuit that supplies a constant current to the input differential pair; an active load that is disposed to correspond to the input differential pair; a first internal capacitative element and a first internal resistive element that are disposed in parallel with each other between one of the input differential pair and the constant current source circuit; and a second internal capacitative element and a second internal resistive element that are disposed in parallel with each other between the other one of the input differential pair and the constant current source circuit.

According to another embodiment of the present invention, a semiconductor apparatus includes: first and second external terminals that are connected to respective both ends of an piezoelectric vibrator, the piezoelectric vibrator being externally disposed; an inverting amplifier that is disposed between the first and second external terminals; a feedback resistance that feeds back an output of the inverting amplifier to an input of the inverting amplifier; a first capacitative element that is disposed between the first external terminal and a reference voltage terminal; and a second capacitative element that is disposed between the second external terminal and the reference voltage terminal. The inverting amplifier includes: a constant current source circuit that is disposed between a first power supply terminal and an output terminal; a switched transistor that is disposed between the output terminal and a second power supply terminal and controlled to be on or off according to an input of the inverting amplifier; a first internal capacitative element that is disposed in series with the switched transistor; and a first internal resistive element that is disposed in parallel with the first internal capacitative element.

According to the above embodiment, it is possible to provide a semiconductor apparatus, an oscillation circuit, and a signal processing system that are capable of easily generating an oscillation signal using various piezoelectric vibrators with different characteristics.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

<Prior Investigation by the Inventors>

An explanation of a prior investigation made by the inventors of the present invention shall be given before an explanation of embodiments.

Figure 23:
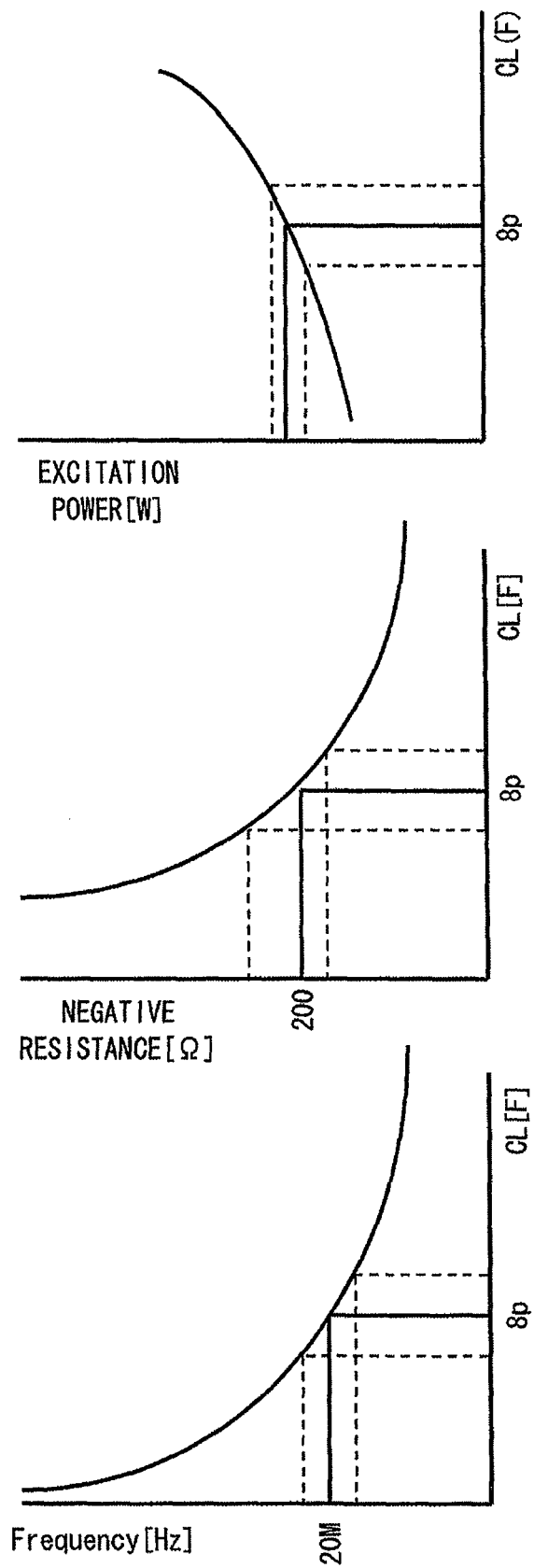
FIG. 23 is a diagram showing a relationship between a load capacitance and an oscillation characteristic in an crystal oscillation circuit.

FIG. 23 is a diagram showing a relationship between a load capacitance and oscillation characteristic in a crystal oscillation circuit.

Firstly, it is necessary for a crystal oscillation circuit to ensure an oscillation frequency within a standard range by adding a load capacitance according to the characteristic of the crystal resonator to the crystal resonator. In the example of FIG. 23, the crystal oscillation circuit adds a load capacitance of 8 pF to the crystal resonator to thereby ensure an oscillation frequency of 20 MHz, which is within the standard range.

Further, the crystal oscillation circuit needs to ensure a negative resistance within a standard range. In other words, the crystal oscillation circuit needs to ensure oscillation allowance of about five to 20 times. In the example of FIG. 23, the crystal oscillation circuit needs to ensure a negative resistance of 200Ω corresponding to a load capacitance of 8 pF (an oscillation frequency of 20 MHz). A relationship between the negative resistance and the oscillation frequency is represented by the following expression (1).

$$-R = Gm/(\omega^2 \cdot Cg \cdot Cd) \quad (1)$$

Note that $-R$ represents the negative resistance, $Gm$ represents a gain of an inverting amplifier, such as an inverter, $\omega$ represents the oscillation frequency, and $Cg$ and $Cd$ represent values of the load capacitances disposed at both ends of the crystal resonator.

According to the expression (1), as the oscillation frequency ($\omega$) of the crystal resonator increases, the negative resistance dramatically decreases. For example, when a crystal resonator for 8 MHz is replaced by a crystal resonator for 24 MHz, the negative resistance is reduced to ⅑, accordingly.

Figure 24:
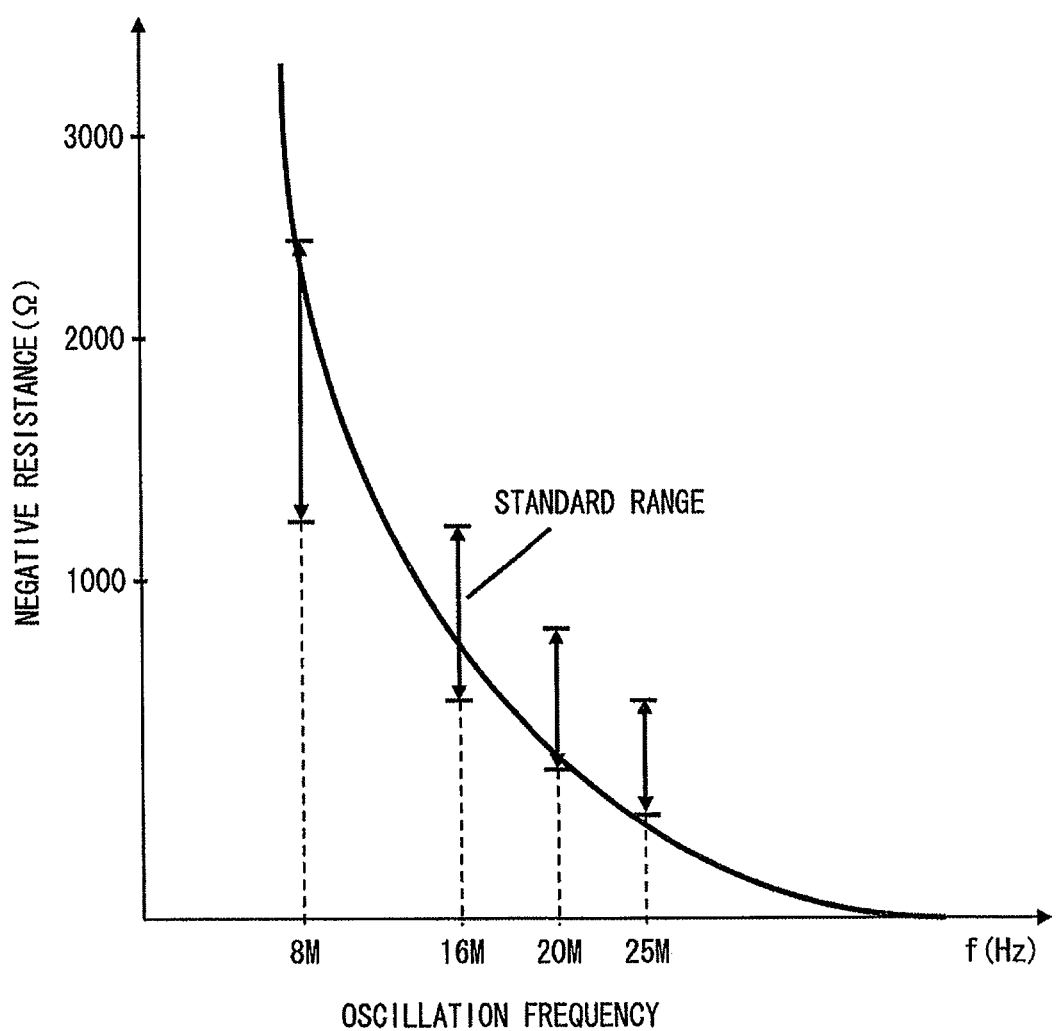
FIG. 24 is a diagram showing a relationship between an oscillation frequency and a negative resistance in the crystal oscillation circuit.

FIG. 24 is a diagram showing a relationship between an oscillation frequency and a negative resistance in a crystal oscillation circuit. As shown in FIG. 24, when the oscillation frequency of the crystal resonator is low, the negative resistance is high, while when the oscillation frequency of the crystal resonator is high, the negative resistance is low. When the oscillation frequency of the crystal resonator is low, the negative resistance exceeds an upper limit of the standard range (specifications), and thus there may be harmonic oscillation. Further, when the oscillation frequency of the crystal resonator is high, the negative resistance falls below a lower limit of the standard range (specifications), and thus there may be no oscillation.

Referring back to FIG. 23, the crystal oscillation circuit also needs to ensure excitation power within a standard range.

In this manner, as it is necessary for the crystal oscillation circuit to satisfy the above-mentioned plurality of demands at the same time (at least to keep the oscillation frequency and the negative resistance within the standard range), it has been considered difficult to easily generate an oscillation signal using various crystal resonators with different characteristics. Even when it is possible to adjust a gain of the inverting amplifier disposed in the crystal oscillation circuit, the gain needs to be finely adjusted every time the crystal resonator is replaced. Accordingly, it has been difficult to easily generate an oscillation signal using various crystal resonators with different characteristics.

Hereinafter, embodiments of the present invention will be described with reference to the accompanying drawings. The drawings are in a simplified form, and the technical scope of the embodiments should not be interpreted to be limited to the drawings. The same elements are denoted by the same reference numerals, and a repeated explanation is omitted.

The invention will be described by dividing it into a plurality of sections or embodiments whenever circumstances require it for convenience in the following embodiments. However, unless otherwise specified in particular, these sections or embodiments are not irrelevant to one another. One section or embodiment is related to modifications, applications, details, supplementary explanations, and the like of some or all of the other ones. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

Further, in the following embodiments, components (including operation steps, etc.) are not always essential unless otherwise specified in particular and considered to be definitely essential in principle. Similarly, when reference is made to the shapes, positional relations, and the like of the components or the like in the following embodiments, they will include ones substantially approximate or similar in their shapes or the like unless otherwise specified in particular and considered not to be definitely so in principle, for example. This is similarly applied even to the above-described number or the like (including the number of pieces, numerical values, quantity, range, etc.).

<First Embodiment>

Figure 1:
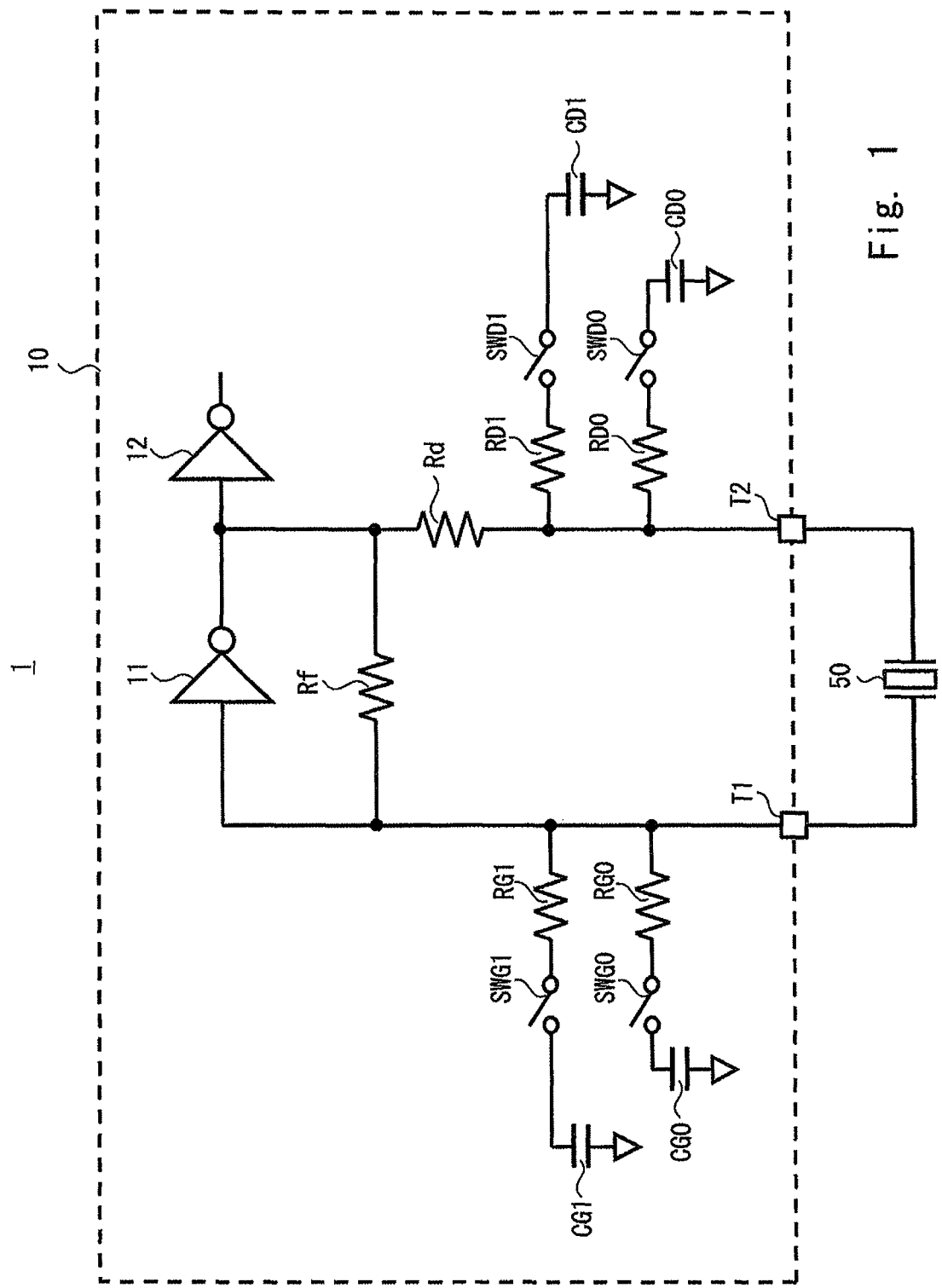
FIG. 1 is a diagram showing a configuration example of an oscillation circuit according to a first embodiment.

FIG. 1 is a diagram showing a configuration example of an oscillation circuit including a semiconductor chip according to a first embodiment. The semiconductor chip according to this embodiment includes at least a first resistive element that is connected in series with a first capacitative element that is disposed at one end of a piezoelectric vibrator and a second resistive element that is connected in series with a second capacitative element that is disposed at the other end of the piezoelectric vibrator. With such a configuration, the semiconductor chip according to this embodiment can easily generate an oscillation signal using various piezoelectric vibrators with different characteristics. A specific explanation of the oscillation circuit shall be given as follows.

The oscillation circuit 1 shown in FIG. 1 includes a semiconductor chip (semiconductor apparatus) 10 and an oscillator 50 that is externally connected to the semiconductor chip 10. In this embodiment, an example is explained in which the oscillator 50 is a crystal resonator, however it is not limited to this. The oscillator 50 may be a different piezoelectric oscillator, such as a ceramic resonator. Hereinafter/the oscillator 50 shall be deemed to be replaced by the crystal resonator 50 in the following explanation.

(Crystal Resonator 50)

The crystal resonator 50 oscillates at a predetermined frequency when a voltage is applied thereon by the semiconductor chip 10. Note that one end of the crystal resonator 50 is connected to an external terminal (a first external terminal) T1 of the semiconductor chip 10, while the other end of the crystal resonator 50 is connected to an external terminal (a second external terminal) T2 of the semiconductor chip 10.

(Semiconductor Chip 10)

The semiconductor chip 10 excites and drives the crystal resonator 50 by applying a voltage on the crystal resonator 50. The semiconductor chip 10 includes inverting amplifiers 11 and 12, a feedback resistance Rf, a damping resistance Rd, a plurality of resistive elements RG0 to RGn and RD0 to RDn (n is a natural number), a plurality of switches SWG0 to SWGn and SWD0 to SWDn, a plurality of capacitative elements CG0 to CGn and CD0 to CDn. In this embodiment, an explanation shall be given assuming that n=1 unless otherwise specified.

The inverting amplifier 11 is connected between the external terminals T1 and T2. More specifically, an input terminal of the inverting amplifier 11 is connected to the external terminal T1, and an output terminal of the inverting amplifier 11 is connected to the external terminal T2. The inverting amplifier 11 inverts logic of an input signal and outputs the inverted signal. Thus, the inverting amplifier 11 can be considered to be an inverter.

The feedback resistance Rf is disposed between the output terminal and the input terminal of the inverting amplifier 11. The feedback resistance Rf feeds back an output of the inverting amplifier 11 to an input of the inverting amplifier 11.

The damping resistance Rd is disposed between the output terminal of the inverting amplifier 11 and the external terminal T2. The damping resistance Rd limits amplitude of an oscillation signal that is output by the inverting amplifier 11. Note that the damping resistance Rd may not be disposed.

The inverting amplifier 12 is disposed on an output side of the inverting amplifier 11. The inverting amplifier 12 inverts logic of an output signal from the inverting amplifier 11 and externally outputs the inverted signal. Thus the inverting amplifier 12 may be considered to be an inverter. Note that the inverting amplifier 12 may not be disposed.

The capacitative element (a first capacitative element) CG0 is disposed between a reference voltage terminal (hereinafter referred to as a reference voltage terminal GND), to which a reference voltage GND is supplied, and the external terminal T1. The resistive element (a first resistive element) RG0 is disposed between the capacitative element CG0 and the external terminal T1 and in series with the capacitative element CG0. The switch (a first switch) SWG0 is disposed in series with the capacitative element CG0 and the resistive element RG0.

The capacitative element (the second capacitative element) CD0 is disposed between the reference voltage terminal GND and the external terminal T2. The resistive element (the second resistive element) RD0 is disposed between the capacitative element CD0 and the external terminal T2 and in series with the capacitative element CD0. The switch (a second switch) SWD0 is disposed in series with the capacitative element CD0 and the resistive element RD0.

The capacitative element (a third capacitative element) CG1 is disposed between the reference voltage terminal GND and the external terminal T1. The resistive element (a third resistive element) RG1 is disposed between the capacitative element CG1 and the external terminal T1 and in series with the capacitative element CG1. The switch (a third switch) SWG1 is disposed in series with the capacitative element CG1 and the resistive element RG1.

The capacitative element (a fourth capacitative element) CD1 is disposed between the reference voltage terminal GND and the external terminal T2. The resistive element (a fourth resistive element) RD1 is disposed between the capacitative element CD1 and the external terminal T2 and in series with the capacitative element CD1. The switch (a fourth switch)

SWD1 is disposed in series with the capacitative element CD1 and the resistive element RD1.

A control unit (not shown in the drawings) that is disposed inside or outside of the semiconductor chip 10 switches the switches SWG0, SWG1, SWD0, and SWD1 on or off. For example, when the switches SWG0 and SWD0 are switched on and the switches SWG1 and SWD1 are switched off, a load capacitance on the crystal resonator 50 decreases. Further, when the switches SWG0 and SWD0 are switched on and the switches SWG1 and SWD1 are also switched on, the load capacitance on the crystal resonator 50 increases. In this manner, the switches SWG0, SWG1, SWD0, and SWD1 are controlled to be on or off, so that the load capacitance on the crystal resonator 50 is adjusted. Note that the load capacitance on the crystal resonator 50 is adjusted at the time of initial setting and then fixed.

When the oscillation frequency of the crystal resonator 50 is high, capacitance values of the capacitative elements CG0, CG1, CD0, and CD1 viewed from the crystal resonator 50 appear to be lower than they actually are due to influences from the resistive elements RG0, RG1, RD0, and RD1, respectively. Thus, the load capacitance on the crystal resonator 50 having a high oscillation frequency becomes low. That is, the negative resistance of the crystal resonator 50 having a high oscillation frequency becomes high. Meanwhile, when the oscillation frequency of the crystal resonator 50 is low, the capacitance values of the capacitive elements CG0, CG1, CD0, and CD1 viewed from the crystal resonator 50 appear to be as high as they actually are without being influenced by the resistive elements RG0, RG1, RD0, and RD1, respectively. Thus, the load capacitance on the crystal resonator 50 having a low oscillation frequency becomes high. That is, the negative resistance on the crystal resonator 50 having a low oscillation frequency becomes low.

Figure 2:
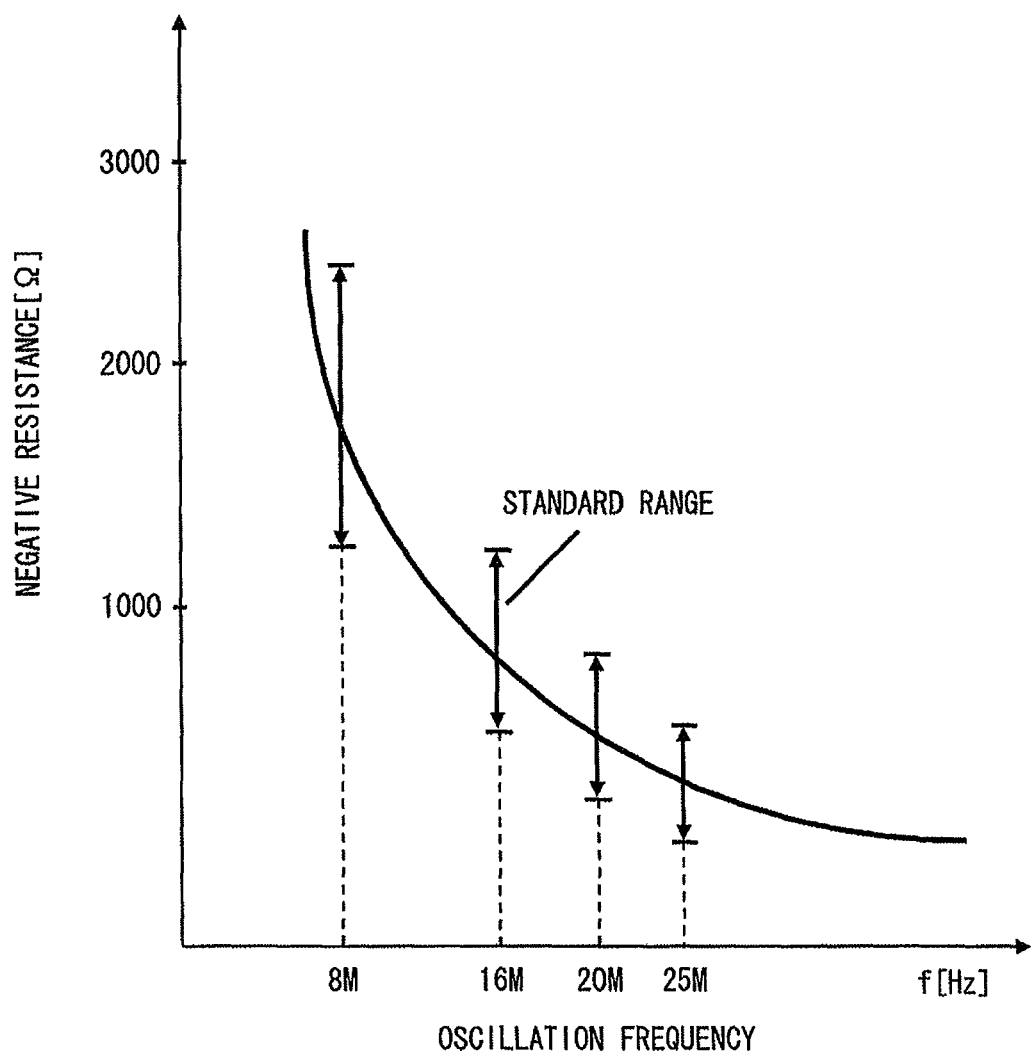
FIG. 2 is a diagram showing a relationship between an oscillation frequency and a negative resistance in the oscillation circuit according to the first embodiment.

FIG. 2 is a diagram showing a relationship between the oscillation frequency and the negative resistance in the oscillation circuit 1. As shown in FIG. 2, when the oscillation frequency of the crystal resonator 50 is high, the negative resistance decreases but is higher than the negative resistance in the case of the example shown in FIG. 24. Further, when the oscillation frequency of the crystal resonator 50 is low, the negative resistance increases but is lower than the negative resistance in the case of the example shown in FIG. 24. Therefore, the negative resistance stays within a standard range (specifications) in the crystal resonator 50 having any oscillation frequency. Consequently, the semiconductor chip 10 according to this embodiment can easily generate an oscillation signal even when the crystal resonator 50 is replaced by a different crystal resonator.

As has been explained above, the semiconductor chip 10 according to this embodiment includes at least the resistive elements (RG0 etc.) that are connected in series with the capacitative elements (CG0 etc.), which are disposed at one end of the crystal resonator 50, and the resistive elements (RD0 etc.) that are connected in series with the capacitative elements (CD0 etc.) that are disposed at the other side of the crystal resonator 50. Thus, the semiconductor chip 10 according to this embodiment can easily generate an oscillation signal using various crystal resonators with different characteristics.

Note that when the oscillation frequency of the crystal resonator 50 is in the range between 8 to 25 MHz, resistance values of the respective resistive elements RD0, RD1, RG0, and RG1 are preferably in the range between a few hundreds Ω to a few dozen kΩ. When the resistance value is too low, all the capacitative elements can be seen from the crystal resonator 50 at any time, while when the resistance value is too high, all the capacitative elements cannot be seen by the crystal resonator 50 at any time.

(First Modified Example of the Oscillation Circuit 1)

Figure 3:
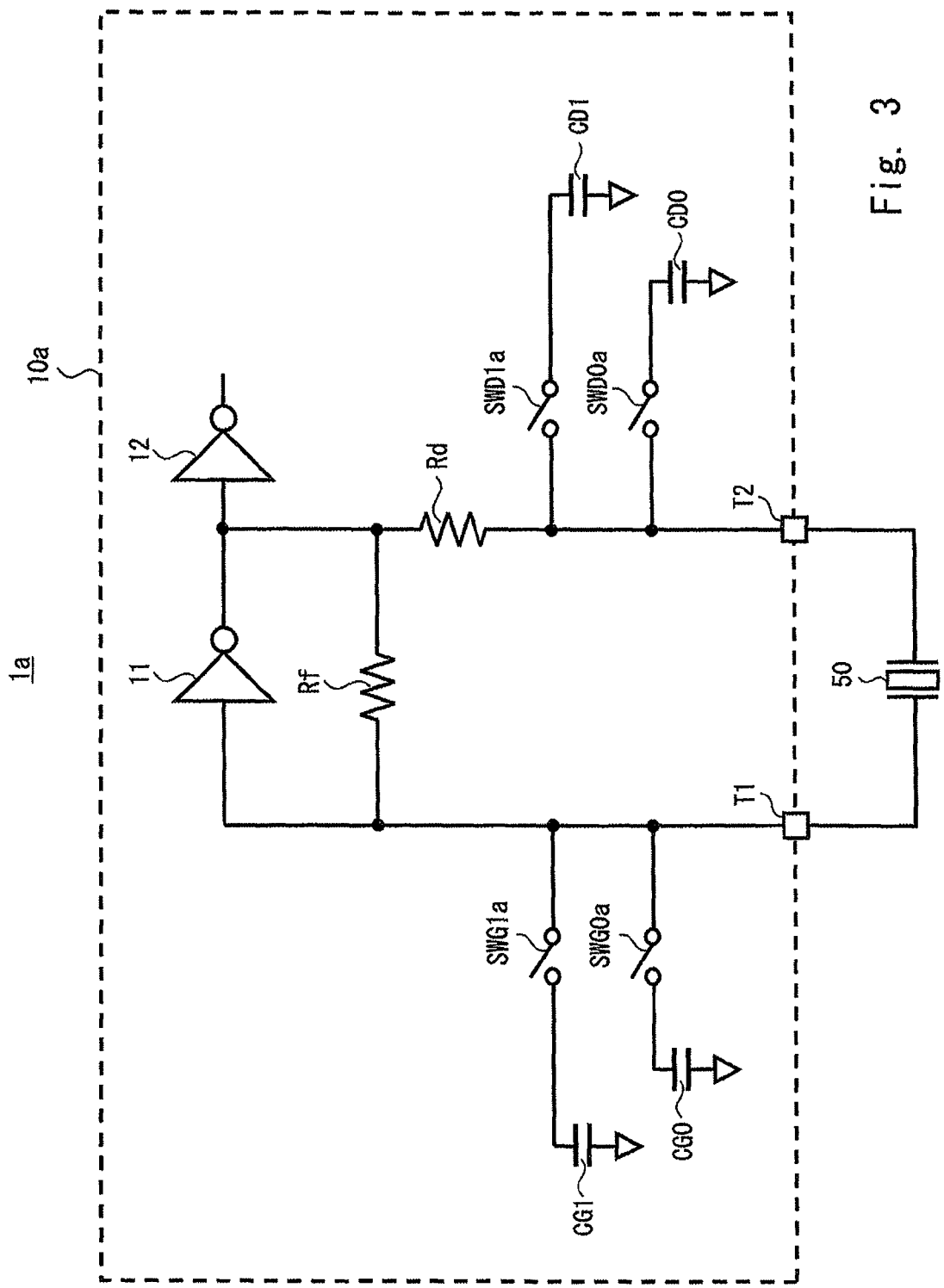
FIG. 3 is a diagram showing a first modified example of the oscillation circuit according to the first embodiment.

FIG. 3 is a diagram showing an oscillation circuit 1a, which is a first modified example of the oscillation circuit 1 shown in FIG. 1. The oscillation circuit 1a shown in FIG. 3 includes a semiconductor chip 10a and a crystal resonator 50.

In comparison to the semiconductor chip 10, the semiconductor chip 10a includes a switch SWG0a in place of the switch SWG0 and the resistive element RG0, a switch SWG1a in place of the switch SWG1 and the resistive element RG1, a switch SWD0a in place of the switch SWD0 and the resistive element RD0, and a switch SWD1a in place of the switch SWD1 and the resistive element RD1. As the rest of the circuit configuration of the semiconductor chip 10a is similar to that of the semiconductor chip 10, an explanation thereof shall be omitted.

Each of the switches SWG0a, SWG1a, SWD0a, and SWD1a is MOS transistor including a silicide block region.

Figure 4:
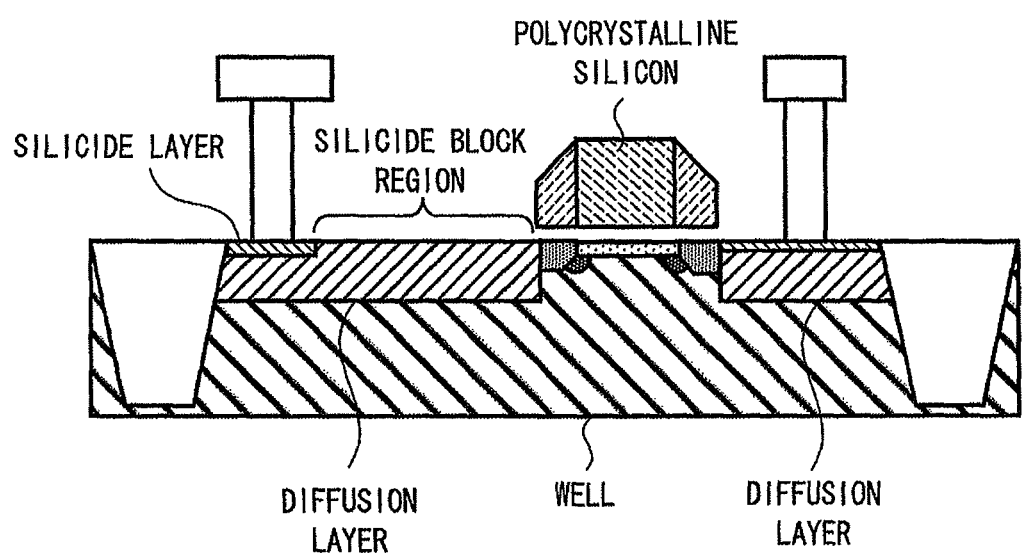
FIG. 4 is a cross-sectional diagram showing a MOS transistor including a silicide block region.

Hereinafter, a MOS transistor including a silicide block region shall be briefly explained with reference to FIG. 4. FIG. 4 is a cross-sectional diagram showing a MOS transistor including a silicide block region. As shown in FIG. 4, in the MOS transistor, two diffusion layers of a second conductive type are disposed above a well of a first conductive type, and further, polycrystalline silicon is disposed above the well, which is between the two diffusion layers, with a silicon oxide film interposed therebetween. Further, silicide layers are formed above surfaces of the two diffusion layers.

A region where the silicide layer is not formed above the region's surface of one of the diffusion layers shall be referred to as a silicide block region. This silicide block region has a high resistance value. Therefore, the silicide block regions in the switches SWG0a, SWG1a, SWD0a, and SWD1a can be regarded as being the resistive elements RG0, RG1, RD0, and RD1, respectively.

The semiconductor chip 10a shown in FIG. 3 can achieve an exemplary advantage equivalent to that achieved by the semiconductor chip 10 shown in FIG. 1.

(Second Modified Example of Oscillation Circuit 1)

Figure 5:
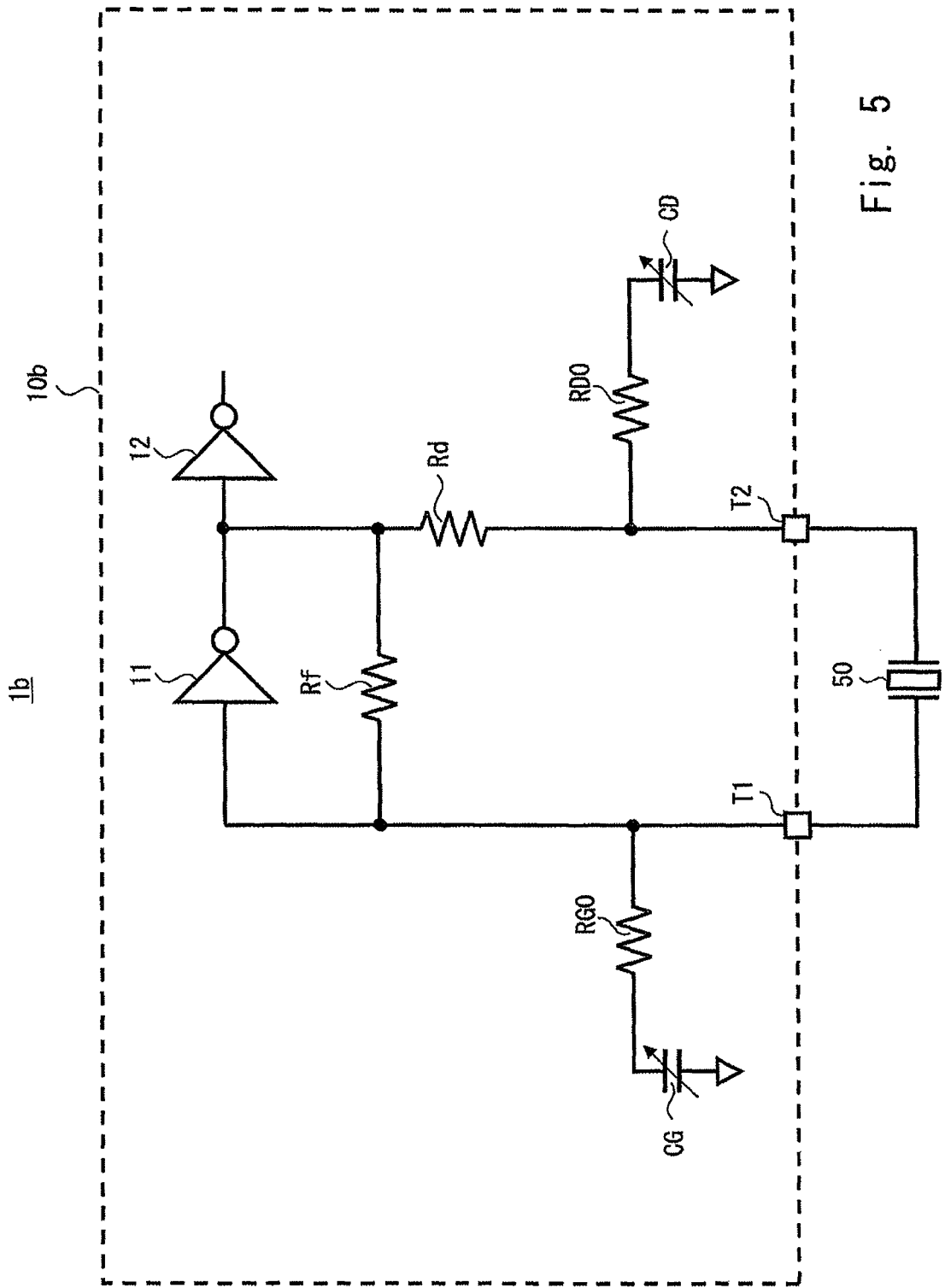
FIG. 5 is a diagram showing a second modified example of the oscillation circuit according to the first embodiment.

FIG. 5 is a diagram showing an oscillation circuit 1b, which is a second modified example of the oscillation circuit 1 shown in FIG. 1. The oscillation circuit 1b shown in FIG. 5 includes a semiconductor chip 10b and a crystal resonator 50.

The semiconductor chip 10b includes inverting amplifiers 11 and 12, a feedback resistance Rf, a damping resistance Rd, resistive elements RG0 and RD0, and variable capacitative elements CG and CD.

The variable capacitative element CG is disposed between the reference voltage terminal GND and the external terminal T1. The resistive element RG0 is disposed between the variable capacitative element CG and the external terminal T1 and in series with the variable capacitative element CG. The variable capacitative element CD is disposed between the reference voltage terminal GND and the external terminal T2. The resistive element RD0 is disposed between the variable capacitative element CD and the external terminal T2 and in series with the variable capacitative element CD. As the rest of the circuit configuration of the semiconductor chip 10b is similar to that of the semiconductor chip 10, an explanation thereof shall be omitted.

The semiconductor chip 10b shown in FIG. 5 can achieve an exemplary advantage equivalent to that achieved by the semiconductor chip 10 shown in FIG. 1.

(Third Modified Example of Oscillation Circuit 1)

Figure 6:
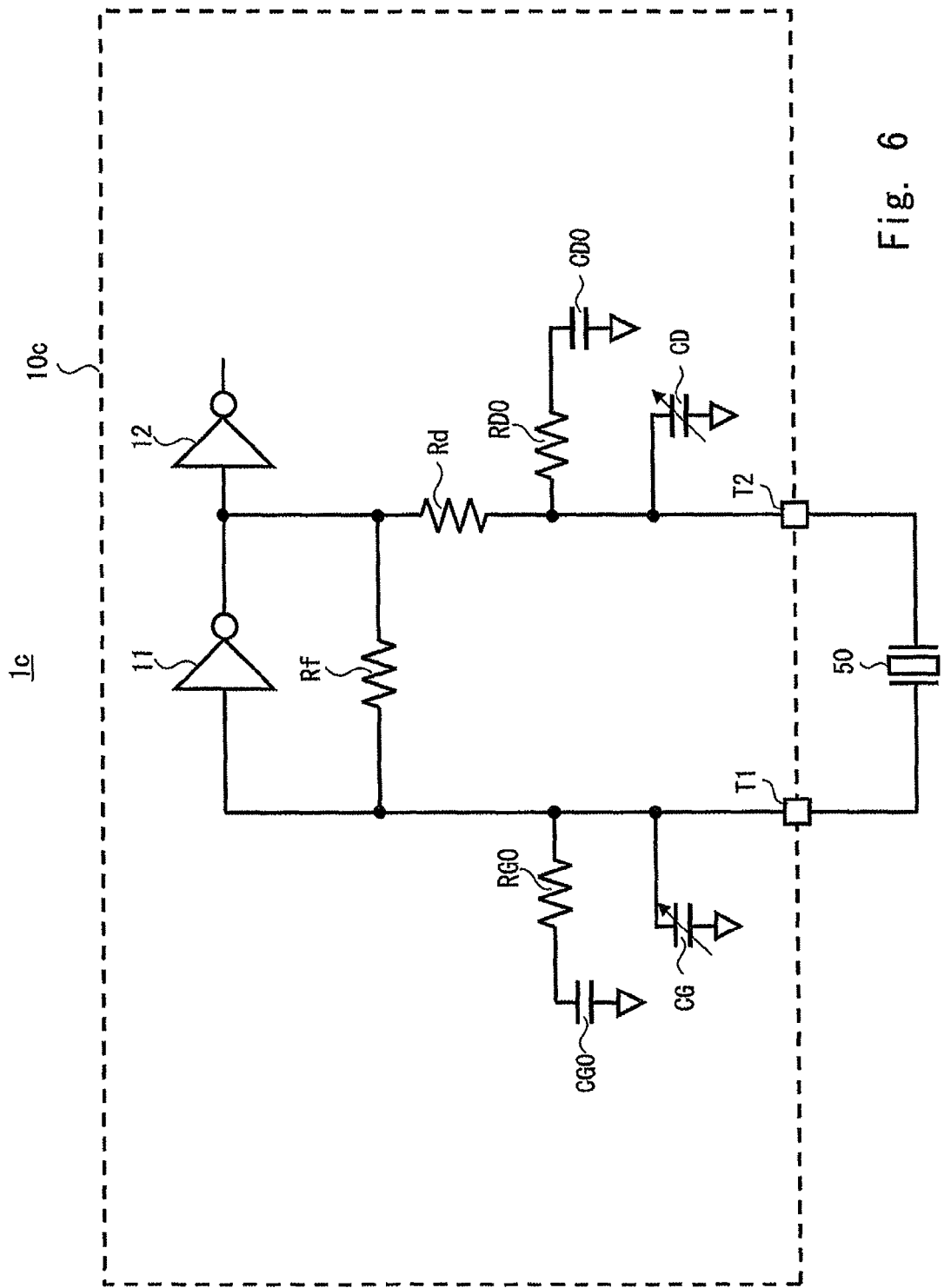
FIG. 6 is a diagram showing a third modified example of the oscillation circuit according to the first embodiment.

FIG. 6 is a diagram showing an oscillation circuit 1c, which is a third modified example of the oscillation circuit 1 shown in FIG. 1. The oscillation circuit 1c shown in FIG. 6 includes a semiconductor chip 10c and a crystal resonator 50.

The semiconductor chip 10c includes inverting amplifiers 11 and 12, a feedback resistance Rf, a damping resistance Rd, resistive elements RG0 and RD0, capacitative elements CG0 and CD0, a variable capacitative element (a first variable capacitative element) CG, and a variable capacitative element (a second variable capacitative element) CD.

The variable capacitative element CG is disposed between the reference voltage terminal GND and the external terminal T1. The variable capacitative element CD is disposed between the reference voltage terminal GND and the external terminal T2. The capacitative element CG0 is disposed between the reference voltage terminal GND and the external terminal T1. The resistive element RG0 is disposed between the capacitative element CG0 and the external terminal T1 and in series with the capacitative element CG0. The capacitative element CD0 is disposed between the reference voltage terminal GND and the external terminal T2. The resistive element RD0 is disposed between the capacitative element CD0 and the external terminal T2 and in series with the capacitative element CD0. As the rest of the circuit configuration of the semiconductor chip 10c is similar to that of the semiconductor chip 10, an explanation thereof shall be omitted.

In the semiconductor chip 10c, there are separate paths for adjusting a load capacitance (a path on the side of CG and CD) and for which the capacitance values of the capacitative elements that are seen by the crystal resonator 50 change according to an oscillation frequency (a path on the side of CG0 and CD0).

The semiconductor chip 10c shown in FIG. 6 can achieve an exemplary advantage equivalent to that achieved by the semiconductor chip 10 shown in FIG. 1.

(Fourth Modified Example of Oscillation Circuit 1)

Figure 7:
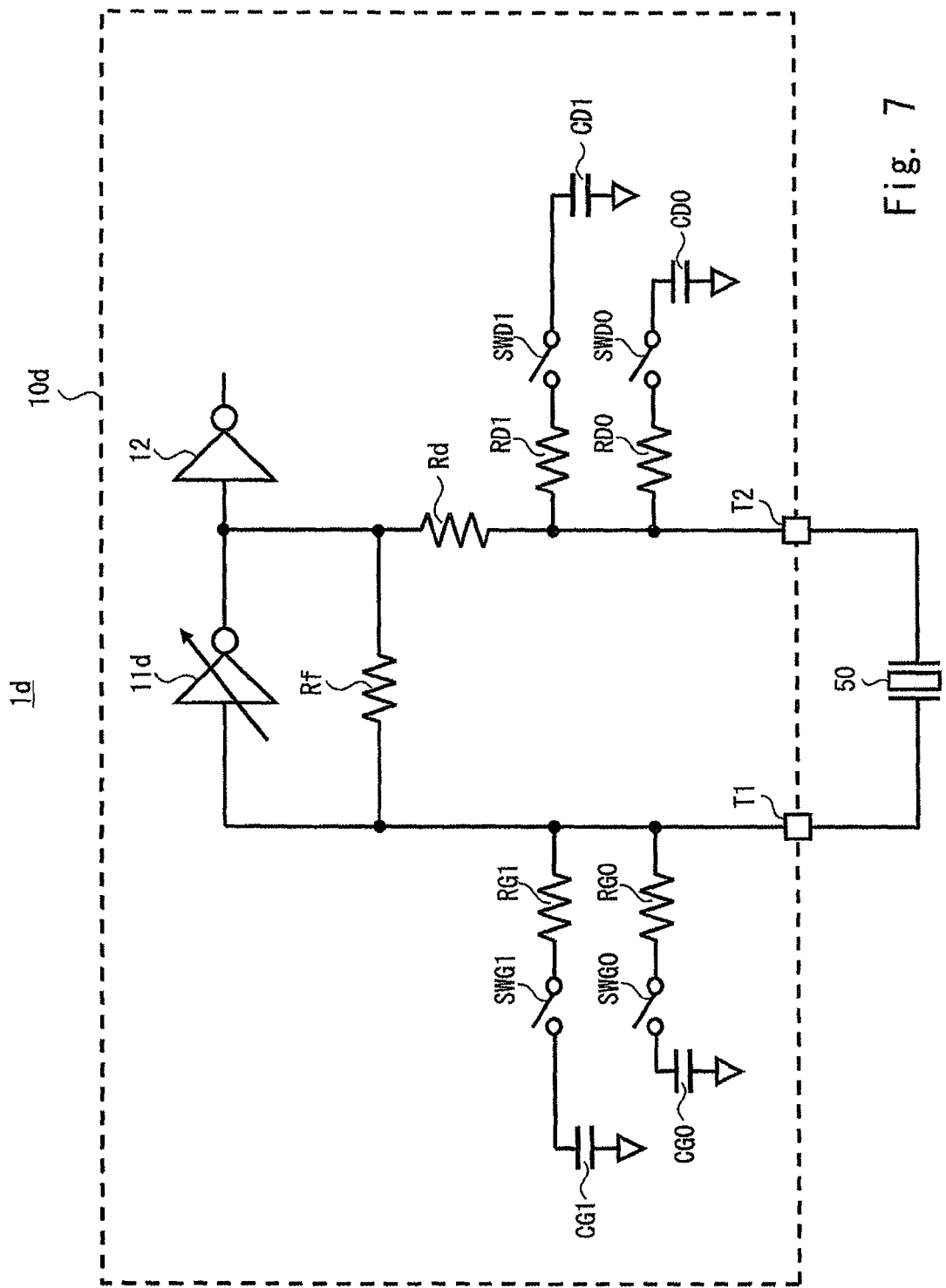
FIG. 7 is a diagram showing a fourth modified example of the oscillation circuit according to the first embodiment.

FIG. 7 is a diagram showing an oscillation circuit 1d, which is a fourth modified example of the oscillation circuit 1 shown in FIG. 1. The oscillation circuit 1d shown in FIG. 7 includes a semiconductor chip 10d and a crystal resonator 50.

In comparison to the semiconductor chip 10, the semiconductor chip 10d includes an inverting amplifier 11d, which is capable of changing a gain, in place of the inverting amplifier 11. As the rest of the circuit configuration of the semiconductor chip 10d is similar to that of the semiconductor chip 10, an explanation thereof shall be omitted.

The semiconductor chip 10d shown in FIG. 7 can achieve an exemplary advantage equivalent to that achieved by the semiconductor chip 10 shown in FIG. 1 and can also adjust a gain.

Figure 8:
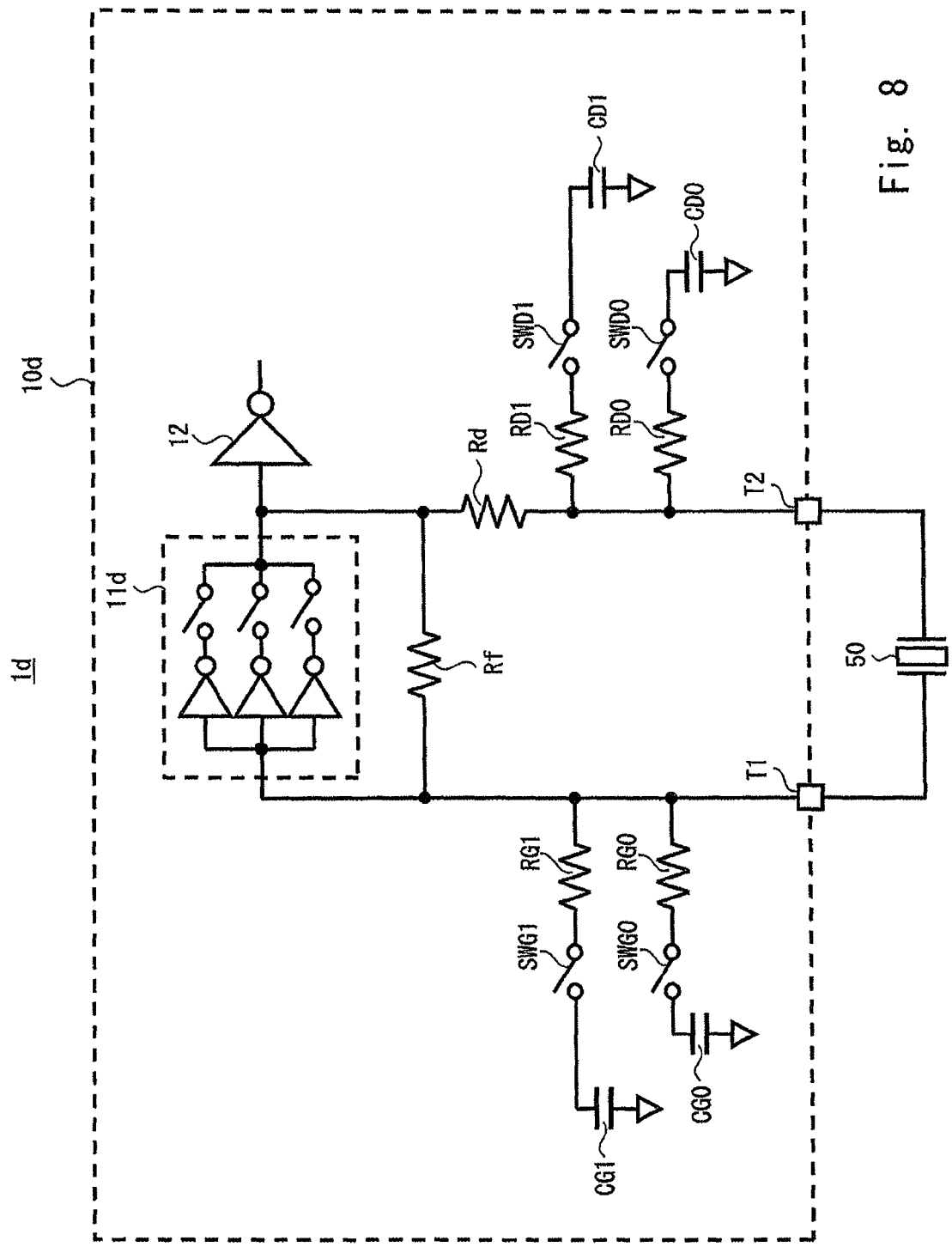
FIG. 8 is a diagram showing a specific configuration example of the oscillation circuit shown in FIG. 7.

FIG. 8 is a diagram showing a specific configuration example of an oscillation circuit 1d shown in FIG. 7. In the oscillation circuit 1d shown in FIG. 8, the inverting amplifier 11d includes a plurality of inverting amplification circuits that are connected in parallel and a plurality of gain switches that are connected in series with the respective plurality of inverting amplification circuits. The inverting amplifier 11d adjusts a gain by switching the plurality of gain switches on or off.

At least any one of the plurality of gain switches inside the inverting amplifier 11d is switched on. In this manner, it is possible to prevent oscillation from stopping while switching the gain of the inverting amplifier 11d.

(Fifth Modified Example of Oscillation Circuit 1)

Figure 9:
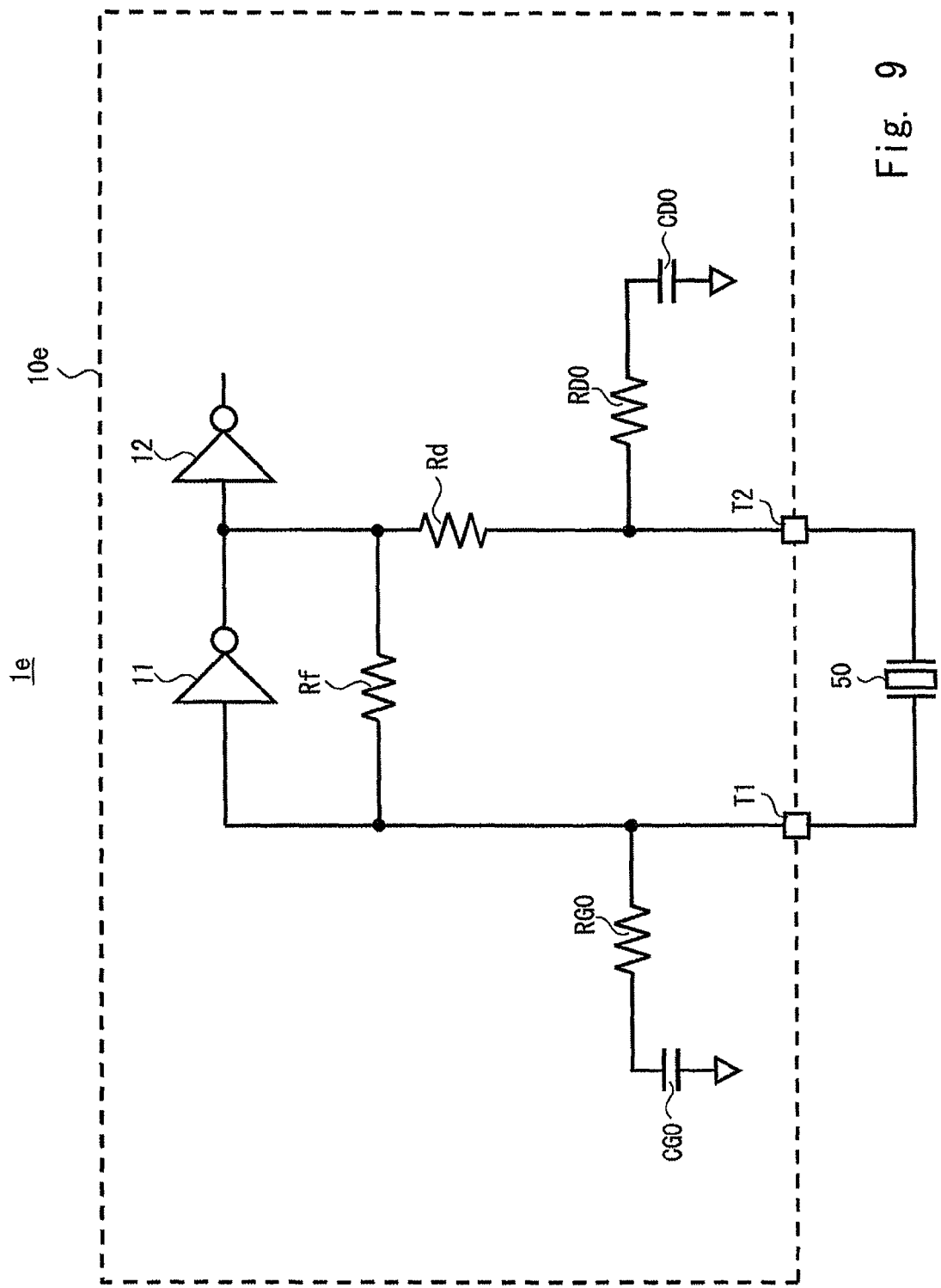
FIG. 9 is a diagram showing a fifth modified example of the oscillation circuit according to the first embodiment.

FIG. 9 is a diagram showing an oscillation circuit 1e, which is a fifth modified example of the oscillation circuit 1 shown in FIG. 1. The oscillation circuit 1e shown in FIG. 9 includes the semiconductor chip 10e and a crystal resonator 50.

The semiconductor chip 10e includes inverting amplifiers 11 and 12, a feedback resistance Rf, a damping resistance Rd, resistive elements RG0 and RD0, and capacitative elements CG0 and CD0.

The capacitive element CG0 is disposed between the reference voltage terminal GND and the external terminal T1. The resistive element RG0 is disposed between the capacitive element CG0 and the external terminal T1 and in series with the capacitive element CG0. The capacitative element CD0 is disposed between the reference voltage terminal GND and the external terminal T2. The resistive element RD0 is disposed between the capacitative element CD0 and the external terminal T2 and in series with the capacitative element CD0. As the rest of the circuit configuration of the semiconductor chip 10e is similar to that of the semiconductor chip 10, an explanation thereof shall be omitted.

When it is not necessary to adjust the load capacitance on the crystal resonator 50, the semiconductor chip 10e shown in FIG. 9 can achieve an exemplary advantage equivalent to that achieved by the semiconductor chip 10 shown in FIG. 1.

(Switching Method of Oscillation Circuit 1)

Figure 10:
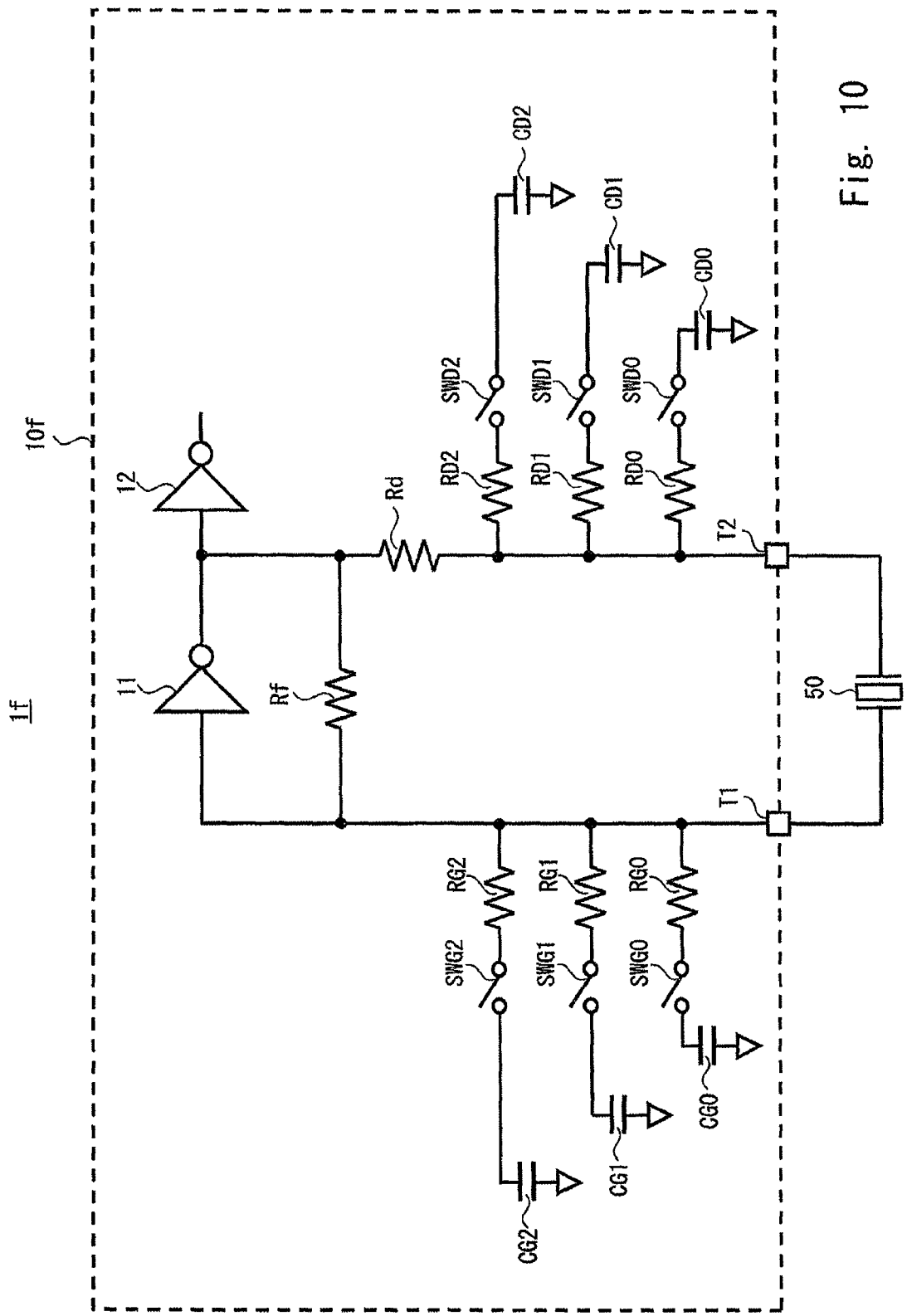
FIG. 10 is a diagram for explaining a switching method of the oscillation circuit according to the first embodiment.

Next, a switching method of the oscillation circuit 1 shall be explained with reference to FIG. 10. FIG. 10 is a diagram for explaining the switching method of the oscillation circuit 1. Note that in FIG. 10, an explanation shall be given assuming that n=2.

Each of the switches SWG0 to SWG2 and SWD0 to SWD2 is switched from off to on at a timing earlier than a timing when it is switched from on to off. When a state is changed from a state where the switches SWG0, SWD0, SWG1, and SWD1 are switched on and the switches SWG2 and SWD2 are switched off to a state where the switches SWG0, SWD0, SWG2, and SWD2 are switched on and the switches SWG1 and SWD1 are switched off, after the switches SWG2 and SWD2 are switched from off to on, the switches SWG1 and SWD1 are switched from on to off. In this way, it is possible to prevent a load capacitance from becoming extremely low and oscillation from stopping while switching the switches.

Note that the above-mentioned plurality of configuration examples and switching method may be combined as appropriate.

<Second Embodiment>

Figure 11:
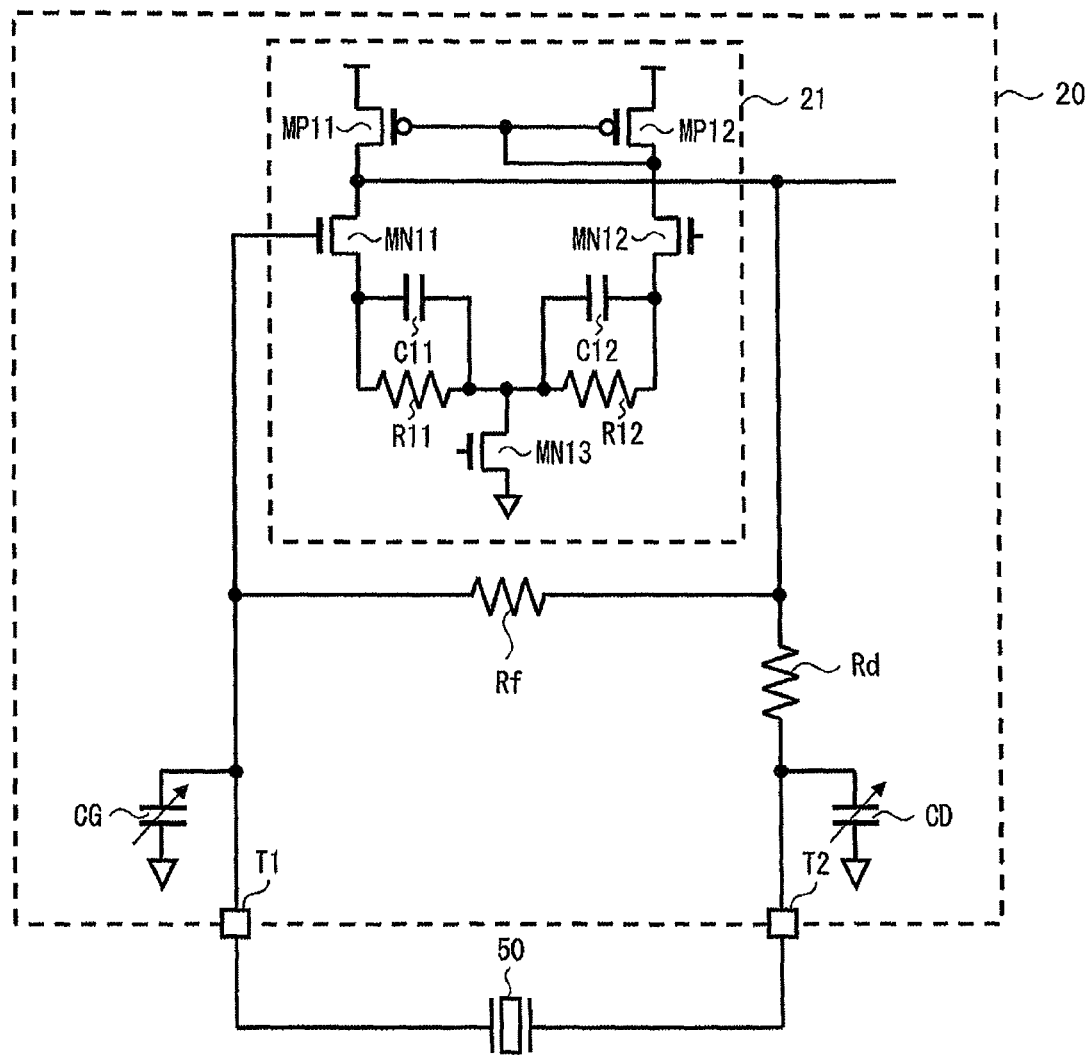
FIG. 11 is a diagram showing a configuration example of the oscillation circuit according to a second embodiment.

FIG. 11 is a diagram showing a configuration example of an oscillation circuit including a semiconductor chip according to a second embodiment. The semiconductor chip according to this embodiment includes an inverting amplifier, a gain of which changes according to an oscillation frequency. Thus, the semiconductor chip according to this embodiment can easily generate an oscillation signal using various piezoelectric vibrators with different characteristics. The oscillation circuit according to his embodiment shall be explained in detail as follows.

The oscillation circuit 2 shown in FIG. 11 includes a semiconductor chip (semiconductor apparatus) 20 and an oscillator 50 that is externally connected to the semiconductor chip 20. In this embodiment, an example is explained in which the oscillator 50 is a crystal resonator, however it is not limited to this. The oscillator 50 may be a different piezoelectric oscillator, such as a ceramic resonator. Hereinafter, the oscillator 50 shall be deemed to be replaced by the crystal resonator 50 in the following explanation.

The semiconductor chip 20 includes an inverting amplifier 21, a feedback resistance Rf, a dumping resistance Rd, and variable capacitative elements CG and CD.

The inverting amplifier 21 is connected between the external terminals T1 and T2. More specifically, an input terminal of the inverting amplifier 21 is connected to the external terminal T1, and an output terminal of the inverting amplifier 21 is connected to the external terminal T2. The feedback resistance Rf is disposed between the output terminal and the input terminal of the inverting amplifier 21. The damping resistance Rd is disposed between the output terminal of the inverting amplifier 21 and the external terminal T2. Note that the damping resistance Rd may not be disposed. The variable capacitative element CG is disposed between the reference voltage terminal GND and the external terminal T1. The variable capacitative element CD is disposed between the reference voltage terminal GND and the external terminal T2.

The inverting amplifier 21 includes transistors MP11, MP12, MN11, MN12, MN13, a resistive element (a first internal resistive element) R11, a resistive element (a second internal resistive element) R12, a capacitative element (a first internal capacitative element) C11, and a capacitative element (a second internal capacitative element) C12. In this embodiment, an example is explained in which the transistors MP11 and MP12 are P-channel MOS transistors, and the transistors MN11, MN12, and MN13 are N-channel MOS transistors.

The transistors MP11 and MP12 constitute an input differential pair. The transistors MN11 and MN12 constitute an active load that is disposed to correspond to the input differential pair. The transistor MN 13 constitutes a constant current source circuit that supplies a constant current to the input differential pair.

Further, the resistive element R11 and the capacitative element C11 are connected in parallel with each other between the source of the transistor MN11 and the drain of the transistor MN13. The resistive element R12 and the capacitative element C12 are connected in parallel with each other between the source of the transistor MN12 and the drain of the transistor MN13.

When the oscillation frequency of the crystal resonator 50 is high, the influence of the capacitative elements C11 and C12 will become greater than the influence of the resistive elements R11 and R12, thereby increasing the gain of the inverting amplifier 21. Thus, the negative resistance of the crystal resonator 50 having a high oscillation frequency will become high. Meanwhile, when the oscillation frequency of the crystal resonator 50 is low, the influence of the resistive elements R11 and R12 will become greater than the influence of the capacitative elements C11 and C12, thereby reducing the gain of the inverting amplifier 21. Thus, the negative resistance of the crystal resonator 50 having a low oscillation frequency will become low. Therefore, the negative resistance stays within a standard range (specifications) in the crystal resonator 50 having any oscillation frequency. Consequently, the semiconductor chip 20 according to this embodiment can easily generate an oscillation signal even when the crystal resonator 50 is replaced by a different crystal resonator.

As has been explained above, the semiconductor chip 20 according to this embodiment includes the inverting amplifier 21, the gain of which changes according to an oscillation frequency. Thus, the semiconductor chip 20 according to this embodiment can easily generate an oscillation signal using various piezoelectric vibrators with different characteristics.

(First Modified Example of Oscillation Circuit 2)

Figure 12:
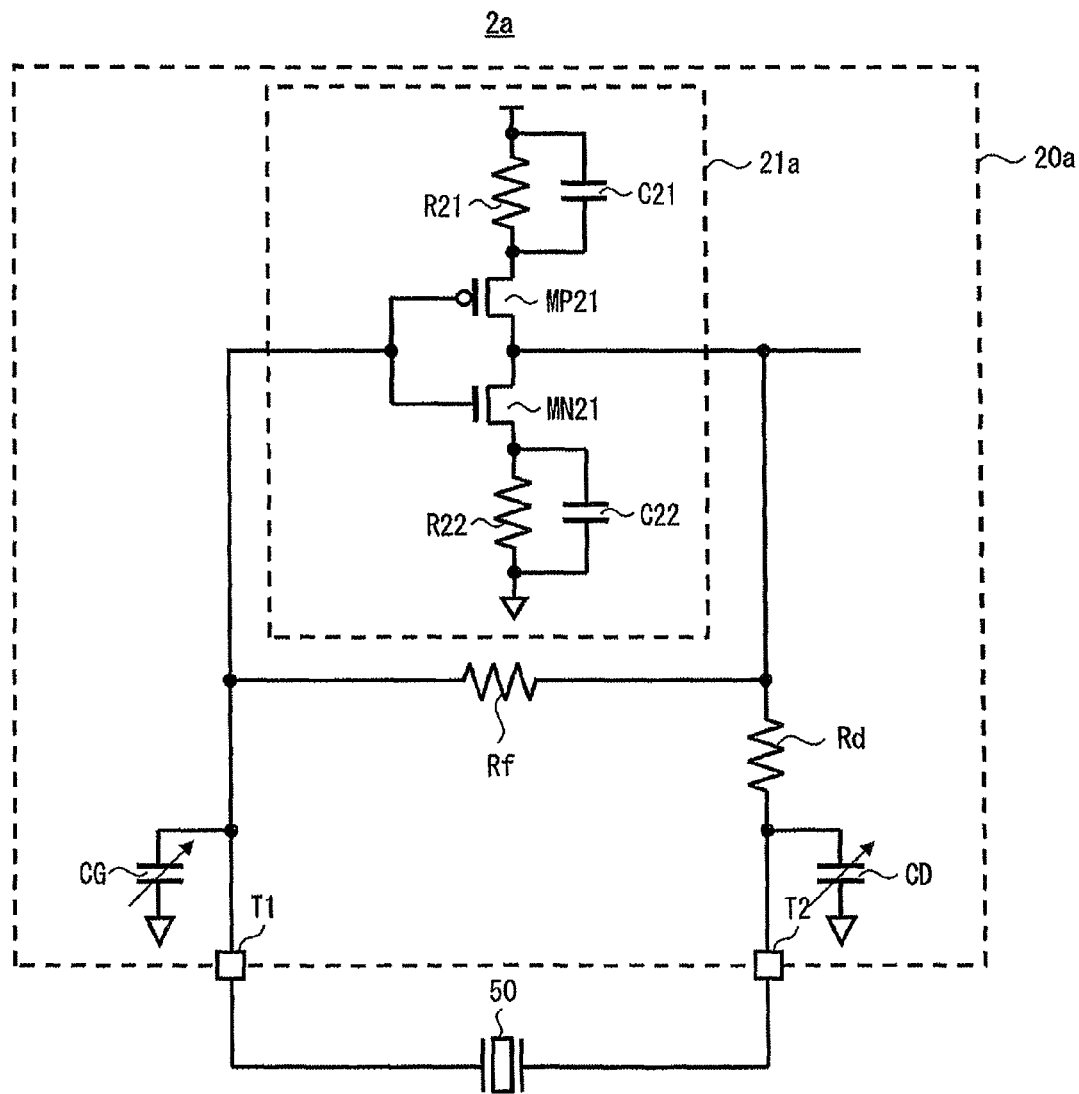
FIG. 12 is a diagram showing a first modified example of the oscillation circuit according to the second embodiment.

FIG. 12 is a diagram showing an oscillation circuit 2a, which is a first modified example of the oscillation circuit 2 shown in FIG. 11. The oscillation circuit 2a shown in FIG. 12 includes a semiconductor chip 20a and a crystal resonator 50.

In comparison to the semiconductor chip 20, the semiconductor chip 20a includes an inverting amplifier 21a in place of the inverting amplifier 21. As the rest of the circuit configuration of the semiconductor chip 20a is similar to that of the semiconductor chip 20, an explanation thereof shall be omitted.

The inverting amplifier 21a is a so-called inverter and includes transistors MP21 and MN21, resistive elements R21 and R22, and capacitative elements C21 and C22. In this embodiment, an example is explained in which the transistor MP21 is a P-channel MOS transistor, and the transistor MN21 is an N-channel MOS transistor.

The transistor MP21 is disposed between a power supply voltage terminal (a first power supply terminal; hereinafter referred to as a power supply voltage terminal VDD) to which a power supply voltage VDD is supplied and an output terminal of the inverting amplifier 21a. Further, the transistor MP21 is switched on or off according to an input signal. The transistor MN21 is disposed between a reference voltage terminal (a second power supply terminal) GND and an output terminal of the inverting amplifier 21a. Further, the transistor MN21 is switched on or off according to the input signal.

Moreover, the resistive element R21 and the capacitive element C21 are disposed in parallel with each other between the power supply voltage terminal VDD and the source of the transistor MP21. The resistive element R22 and the capacitative element C22 are disposed in parallel with each other between the reference voltage terminal. GND and the source of the transistor MN21.

The semiconductor chip 20a shown in FIG. 12 can achieve an exemplary advantage equivalent to that achieved by the semiconductor chip 20 shown in FIG. 11.

(Second Modified Example of Oscillation Circuit 2)

Figure 13:
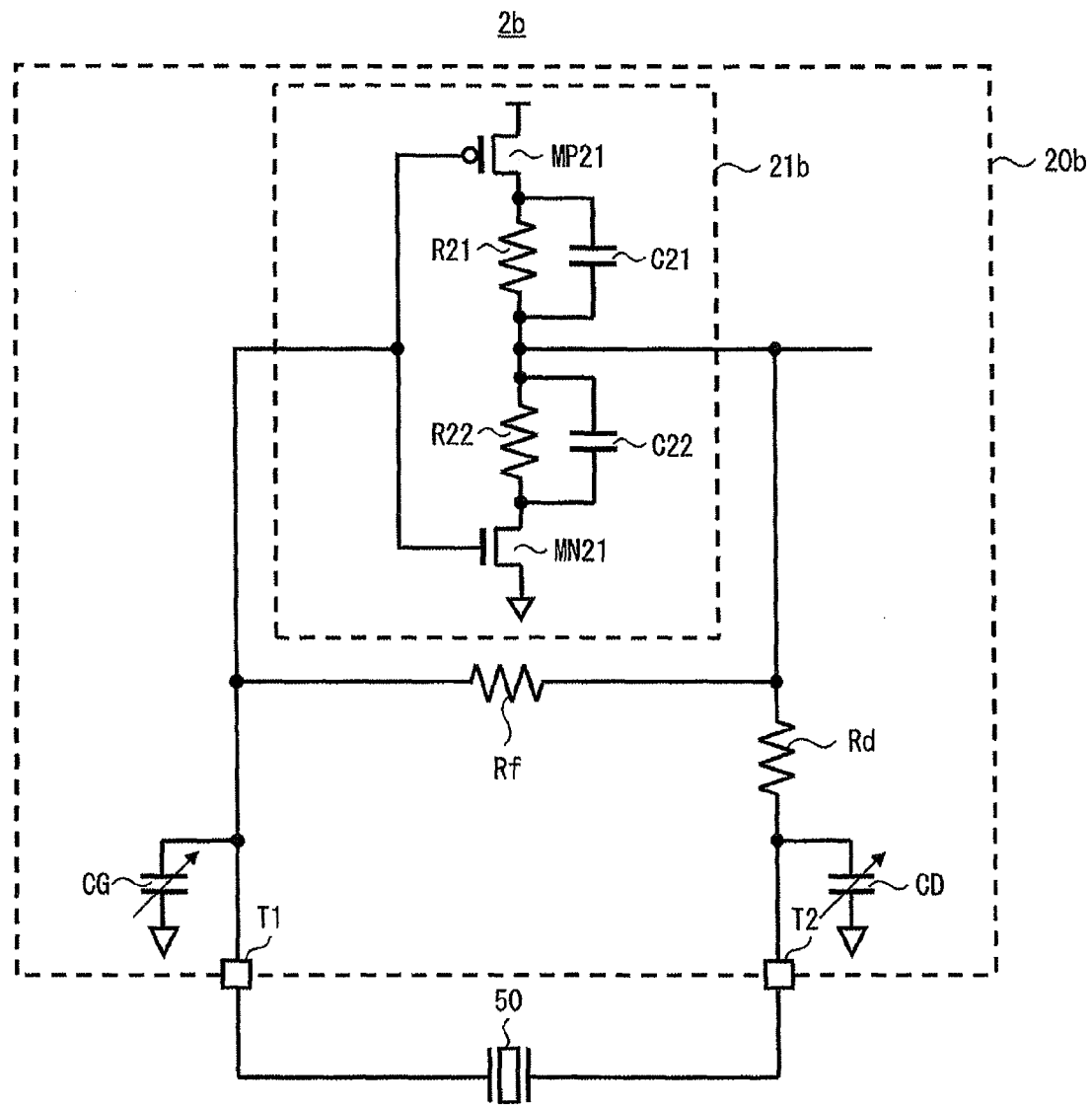
FIG. 13 is a diagram showing a second modified example of the oscillation circuit according to the second embodiment.

FIG. 13 is a diagram showing an oscillation circuit 2b, which is a second modified example of the oscillation circuit 2 shown in FIG. 11. The oscillation circuit 2b shown in FIG. 13 includes a semiconductor chip 20b and a crystal resonator 50.

In comparison to the semiconductor chip 20, the semiconductor chip 20b includes an inverting amplifier 21b in place of the inverting amplifier 21. As the rest of the circuit configuration of the semiconductor chip 20b is similar to that of the semiconductor chip 20, an explanation thereof shall be omitted.

The inverting amplifier 21b differs from the inverting amplifier 21a as to locations where the resistive element R21 and the capacitative element C21 are disposed and locations where the resistive element R22 and the capacitative element C22 are disposed. Specifically, the resistive element R21 and the capacitive element C21 are disposed in parallel with each other between the drain of the transistor MP21 and an output terminal of the inverting amplifier 21b. The resistive element R22 and the capacitative element C22 are disposed in parallel with each other between the drain of the transistor MN21 and the output terminal of the inverting amplifier 21b.

The semiconductor chip 20b shown in FIG. 13 can achieve an exemplary advantage equivalent to that achieved by the semiconductor chip 20 shown in FIG. 11.

(Third Modified Example of Oscillation Circuit 2)

Figure 14:
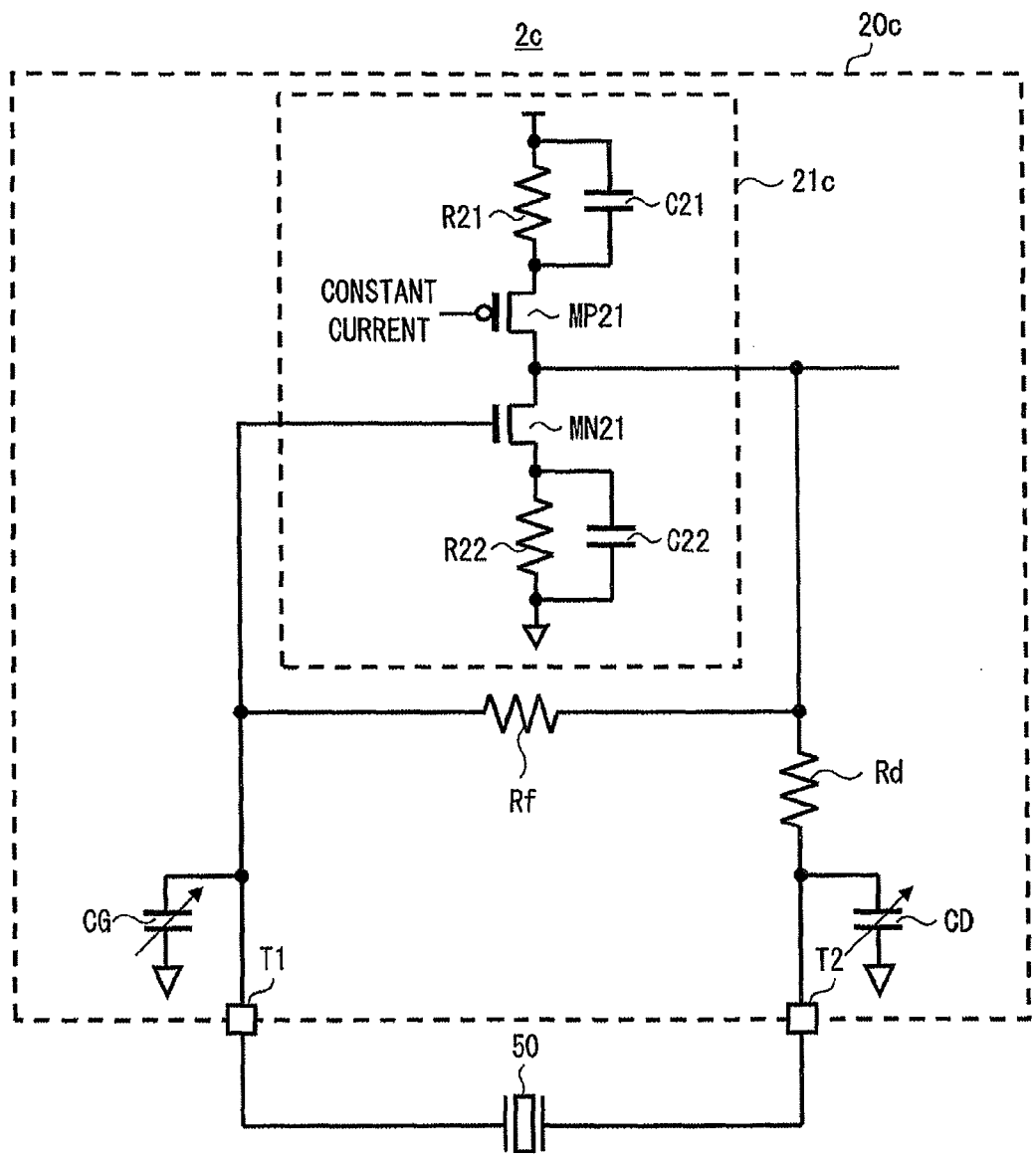
FIG. 14 is a diagram showing a third modified example of the oscillation circuit according to the second embodiment.

FIG. 14 is a diagram showing an oscillation circuit 2c, which is a third modified example of the oscillation circuit 2 shown in FIG. 11. The oscillation circuit 2c shown in FIG. 14 includes a semiconductor chip 20c and a crystal resonator 50.

In comparison to the semiconductor chip 20, the semiconductor chip 20c includes an inverting amplifier 21c in place of the inverting amplifier 21. As the rest of the circuit configuration of the semiconductor chip 20c is similar to that of the semiconductor chip 20, an explanation thereof shall be omitted.

The inverting amplifier 21c includes a transistor (a constant current source circuit) MP21, a transistor (a switched transistor) MN21, a resistive element (a second internal resistive element) R21, a resistive element (a first internal resistive element) R22, a capacitative element (a second internal capacitative element) C21, and a capacitative element (a first internal capacitative element) C22.

In comparison to the inverting amplifier 21a, in the inverting amplifier 21c, the gate of the transistor MP21 is supplied with a constant current instead of an input signal of the inverting amplifier 21c. That is, the transistor MP21 operates as a constant current source circuit.

The semiconductor chip 20c shown in FIG. 14 can achieve an exemplary advantage equivalent to that achieved by the semiconductor chip 20 shown in FIG. 11. Note that instead of the gate of the transistor MP21, the gate of the transistor MN21 may be supplied with a constant current.

(Fourth Modified Example of Oscillation Circuit 2)

Figure 15:
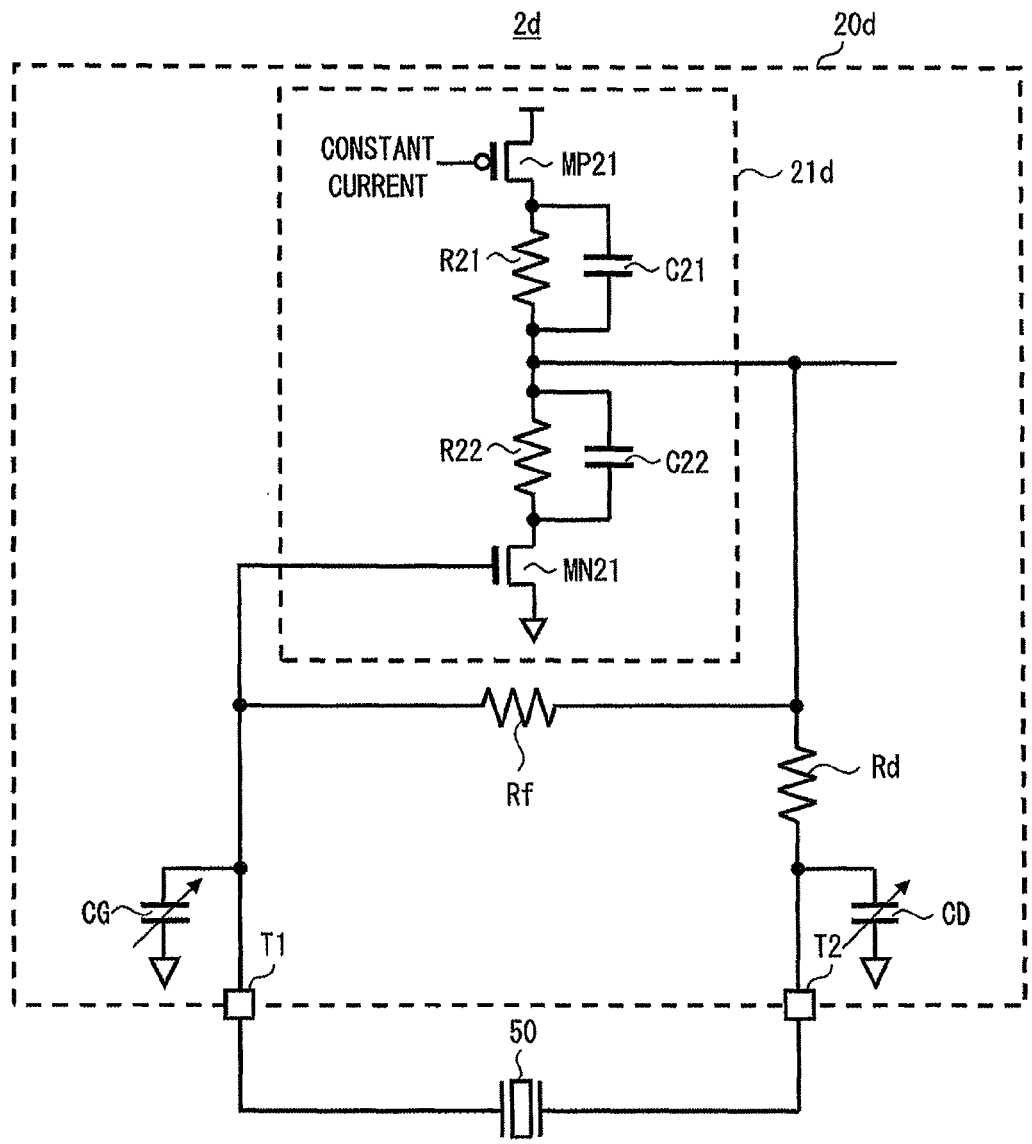
FIG. 15 is a diagram showing a fourth modified example of the oscillation circuit according to the second embodiment.

FIG. 15 is a diagram showing an oscillation circuit 2d, which is a fourth modified example of the oscillation circuit 2 shown in FIG. 11. The oscillation circuit 2d shown in FIG. 15 includes a semiconductor chip 20d and a crystal resonator 50.

In comparison to the semiconductor chip 20, the semiconductor chip 20d includes an inverting amplifier 21d in place of the inverting amplifier 21. As the rest of the circuit configuration of the semiconductor chip 20d is similar to that of the semiconductor chip 20, an explanation thereof shall be omitted.

The inverting amplifier 21d includes a transistor MP21, a transistor MN21, resistance elements R21 and R22, and capacitative elements C21 and C22.

In comparison to the inverting amplifier 21b, in the inverting amplifier 21d, the gate of the transistor MP21 is supplied with a constant current instead of an input signal of the inverting amplifier 21d. That is, the transistor MP21 operates as a constant current source circuit.

The semiconductor chip 20d shown in FIG. 15 can achieve an exemplary advantage equivalent to that achieved by the semiconductor chip 20 shown in FIG. 11. Note that instead of the gate of the transistor MP21, the gate of the transistor MN21 may be supplied with the constant current.

(Fifth Modified Example of Oscillation Circuit 2)

Figure 16:
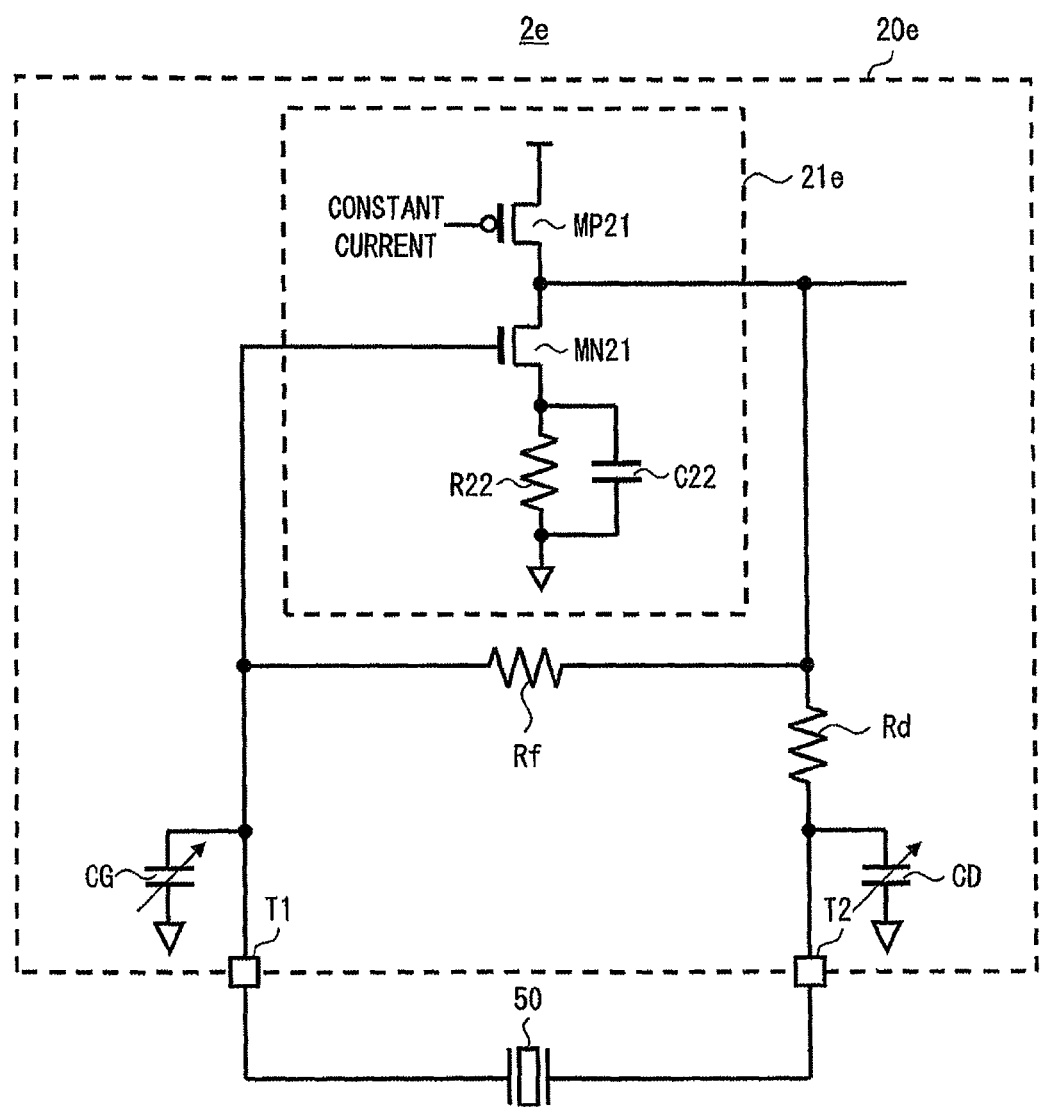
FIG. 16 is a diagram showing a fifth modified example of the oscillation circuit according to the second embodiment.

FIG. 16 is a diagram showing an oscillation circuit 2e, which is a fifth modified example of the oscillation circuit 2 shown in FIG. 11. The oscillation circuit 2e shown in FIG. 16 includes a semiconductor chip 20e and a crystal resonator 50.

In comparison to the semiconductor chip 20, the semiconductor chip 20e includes an inverting amplifier 21e in place of the inverting amplifier 21. As the rest of the circuit configuration of the semiconductor chip 20e is similar to that of the semiconductor chip 20, an explanation thereof shall be omitted.

The inverting amplifier 21e differs from the inverting amplifier 21c in that the inverting amplifier 21e does not include the resistive element R21 and the capacitative element C21.

The semiconductor chip 20e shown in FIG. 16 can achieve an exemplary advantage equivalent to that achieved by the semiconductor chip 20 shown in FIG. 11. Note that instead of the gate of the transistor MP21, the gate of the transistor MN21 may be supplied with a constant current.

(Sixth Modified Example of Oscillation Circuit 2)

Figure 17:
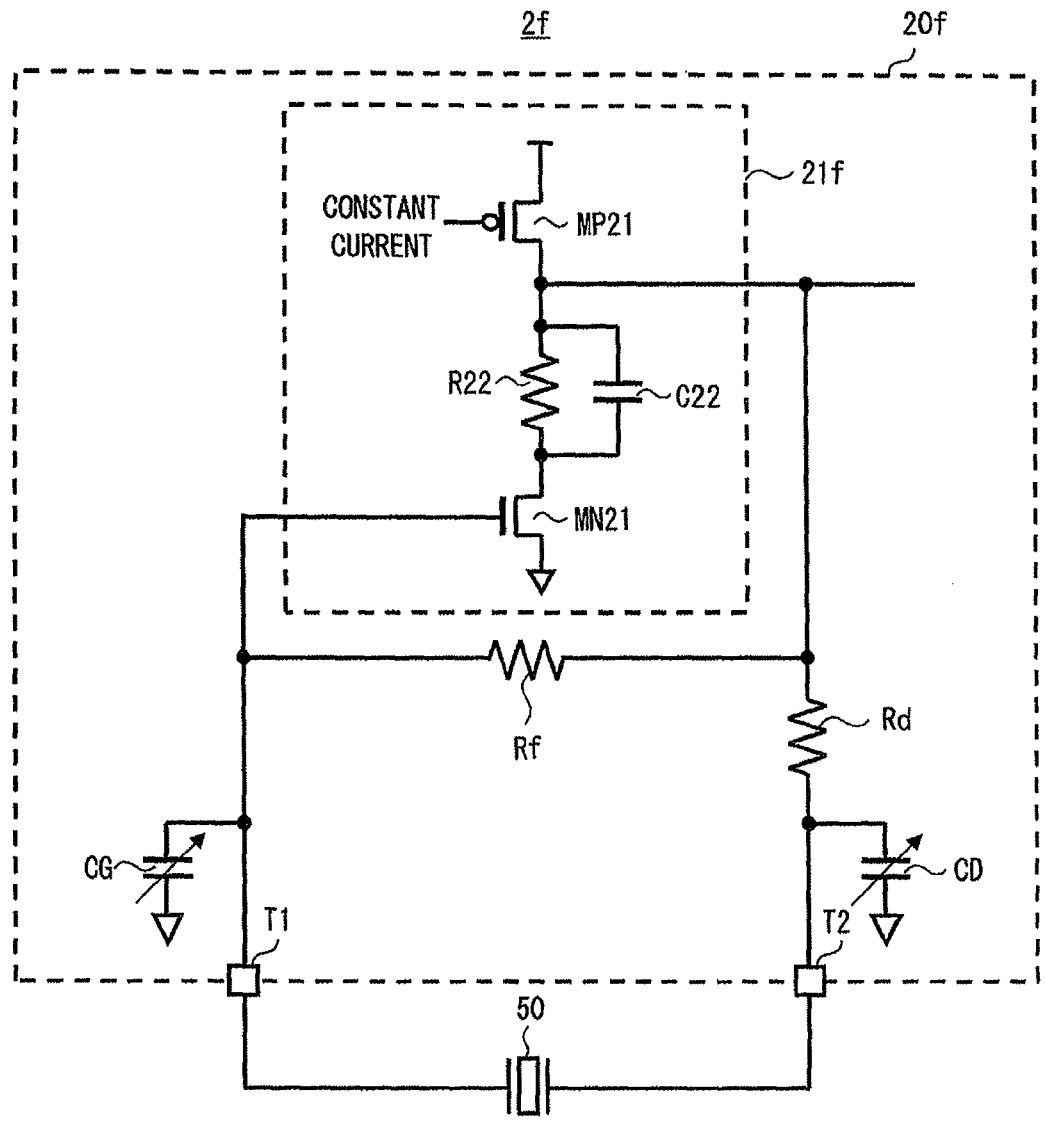
FIG. 17 is a diagram showing a sixth modified example of the oscillation circuit according to the second embodiment.

FIG. 17 is a diagram showing an oscillation circuit 2f, which is a sixth modified example of the oscillation circuit 2 shown in FIG. 11. The oscillation circuit 2f shown in FIG. 17 includes a semiconductor chip 20f and a crystal resonator 50.

In comparison to the semiconductor chip 20, the semiconductor chip 20f includes an inverting amplifier 21f in place of the inverting amplifier 21. As the rest of the circuit configuration of the semiconductor chip 20f is similar to that of the semiconductor chip 20, an explanation thereof shall be omitted.

The inverting amplifier 21f differs from the inverting amplifier 21d in that the inverting amplifier 21f does not include the resistive element R21 and the capacitative element C21.

The semiconductor chip 20f shown in FIG. 17 can achieve an exemplary advantage equivalent to that achieved by the semiconductor chip 20 shown in FIG. 11. Note that instead of the gate of the transistor MP21, the gate of the transistor MN21 may be supplied with a constant current.

(Seventh Modified Example of Oscillation Circuit 2)

Figure 18:
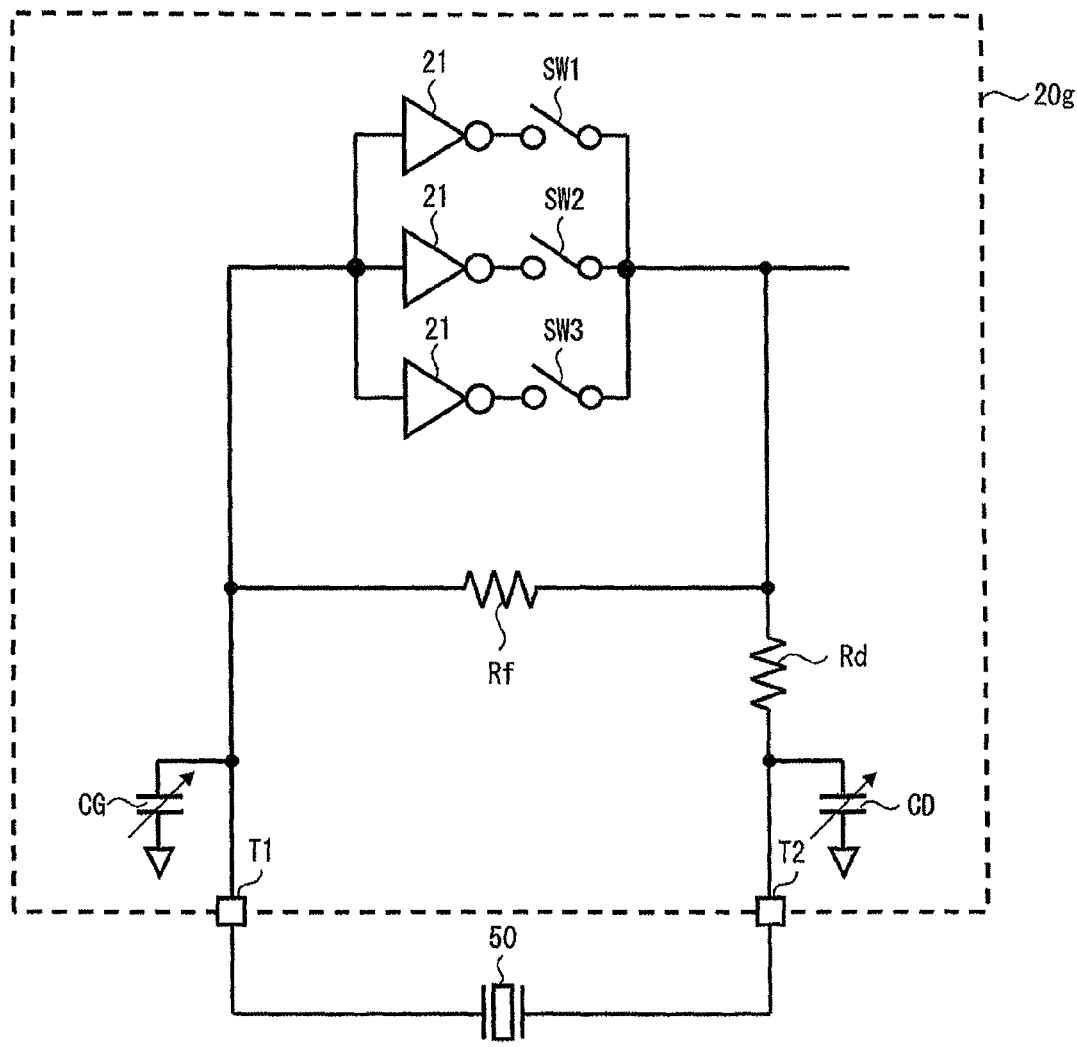
FIG. 18 is a diagram showing a seventh modified example of the oscillation circuit according to the second embodiment.

FIG. 18 is a diagram showing an oscillation circuit 2g, which is a seventh modified example of the oscillation circuit 2 shown in FIG. 11. The oscillation circuit 2g shown in FIG. 18 includes a semiconductor chip 20g and a crystal resonator 50.

In comparison to the semiconductor chip 20, the semiconductor chip 20g includes a plurality of inverting amplifiers 21 that are disposed in parallel with each other and a plurality of gain switches SW that are respectively connected in series with the plurality of inverting amplifiers 21. As the rest of the circuit configuration of the semiconductor chip 20g is similar to that of the semiconductor chip 20, an explanation thereof shall be omitted.

The semiconductor chip 20g shown in FIG. 18 can achieve an exemplary advantage equivalent to that achieved by the semiconductor chip 20 shown in FIG. 11 and can also adjust a gain. Note that at least one of the plurality of gain switches SW is switched on. In this way, it is possible to prevent oscillation from stopping while switching the gain.

(Eighth Modified Example of Oscillation Circuit 2)

Figure 19:
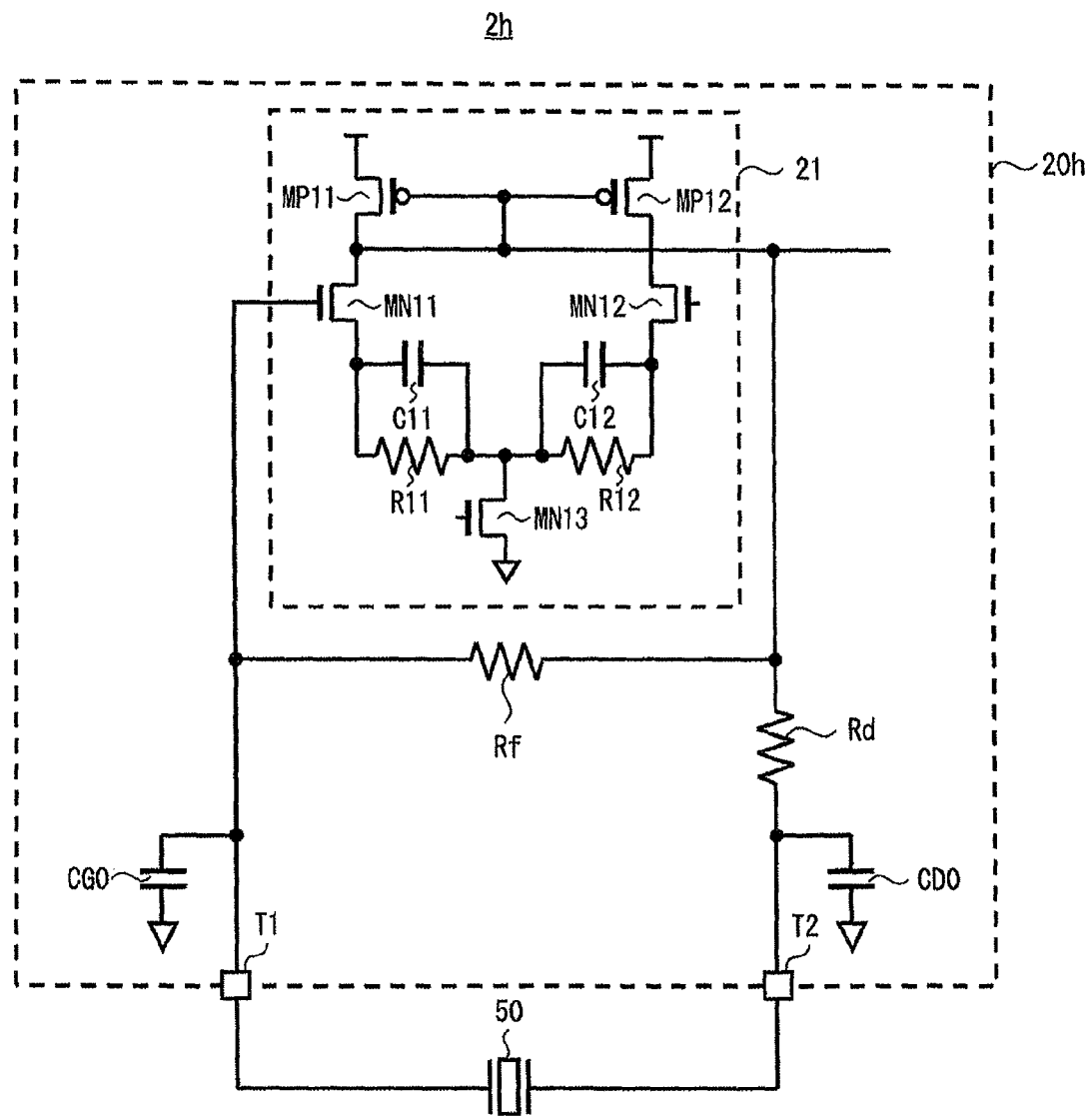
FIG. 19 is a diagram showing an eighth modified example of the oscillation circuit according to the second embodiment.

FIG. 19 is a diagram showing an oscillation circuit 2h, which is an eighth modified example of the oscillation circuit 2 shown in FIG. 11. The oscillation circuit 2h shown in FIG. 19 includes a semiconductor chip 20h and a crystal resonator 50.

In comparison to the semiconductor chip 20, the semiconductor chip 20h includes capacitative elements CG0 and CD0 in place of the variable capacitative elements CG and CD. As the rest of the circuit configuration of the semiconductor chip 20h is similar to that of the semiconductor chip 20, an explanation thereof shall be omitted.

When it is not necessary to adjust the load capacitance on the crystal resonator 50, the semiconductor chip 20h shown in FIG. 19 can achieve an exemplary advantage equivalent to that achieved by the semiconductor chip 20 shown in FIG. 11.

Note that the above-mentioned plurality of configuration examples may be implemented in combination as appropriate. Further, the above-mentioned plurality of configuration examples may be implemented in combination with the configuration of the first embodiment.

<Third Embodiment>

Figure 20:
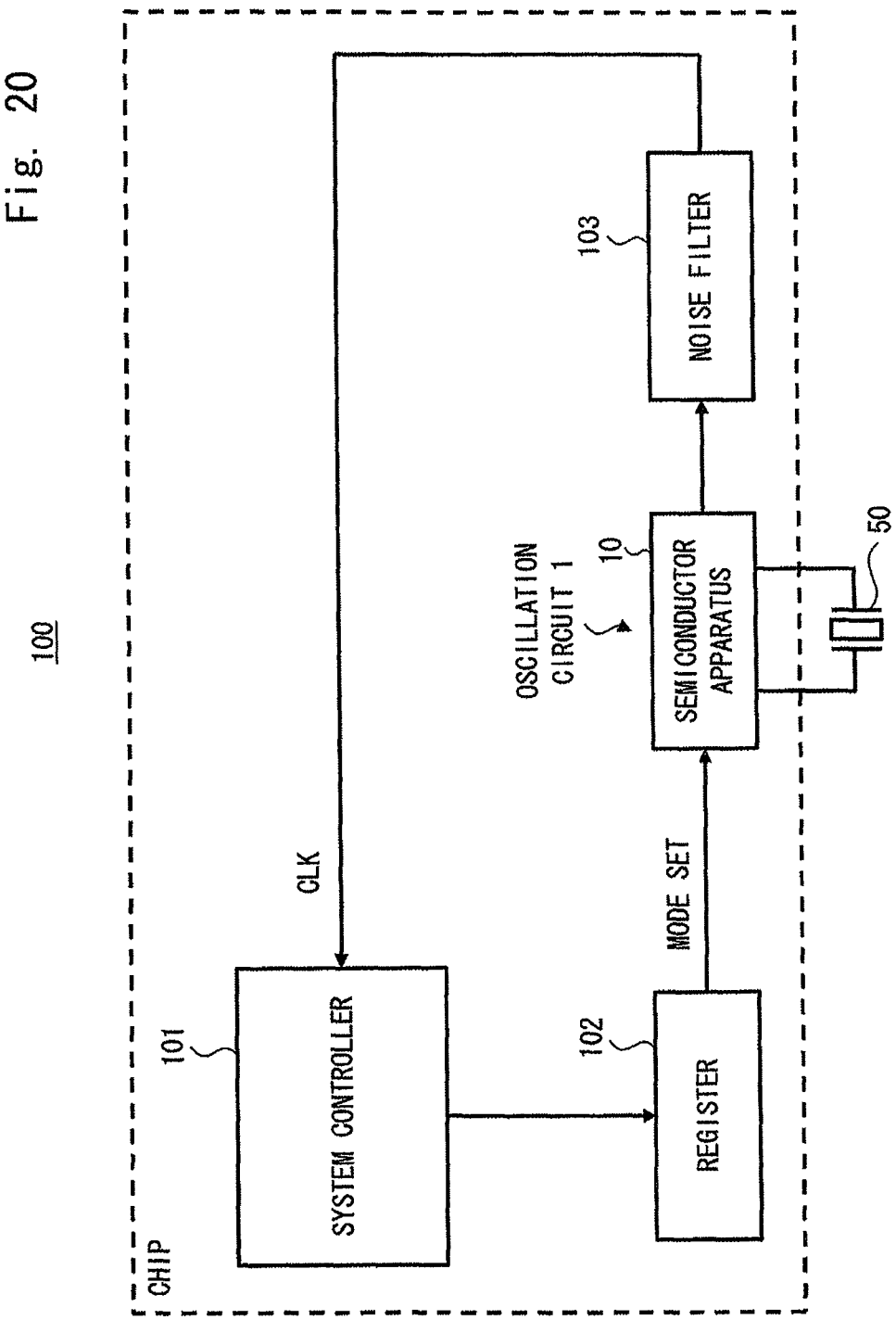
FIG. 20 is a block diagram showing a signal processing system according to a third embodiment.

FIG. 20 is a diagram showing a configuration example of a signal processing system according to a third embodiment. In the example of FIG. 20, the oscillation circuit 1 shown in FIG. 1 is incorporated in the signal processing system. A specific explanation of the signal processing system shall be given below.

A signal processing system 100 shown in FIG. 20 includes the oscillation circuit 1, a noise filter 103, a system controller (a control unit) 101, and a register 102. The oscillation circuit 1 generates an oscillation signal and outputs the oscillation signal as a clock signal CLK. The noise filter 103 removes noise from the clock signal CLK. The system controller 101 synchronizes with the clock signal CLK and controls execution of various processing. Further, the system controller 101 synchronizes with a harmonic clock signal CLK or a clock signal CLK having a predetermined frequency and controls a trimming signal. Specifically, the system controller 101, at the time of startup, synchronizes with the harmonic clock signal CLK or the clock signal CLK having a predetermined frequency and activates the trimming signal. The register 102 stores, for example, on/off switch information etc. of the switch disposed in the oscillation circuit 1 as mode set information (configuration information). When the trimming signal is activated, the register 102 outputs the mode set information to the oscillation circuit 1. In this manner, the oscillation circuit 1 can generate an oscillation signal having a predetermined oscillation frequency.

Figure 21:
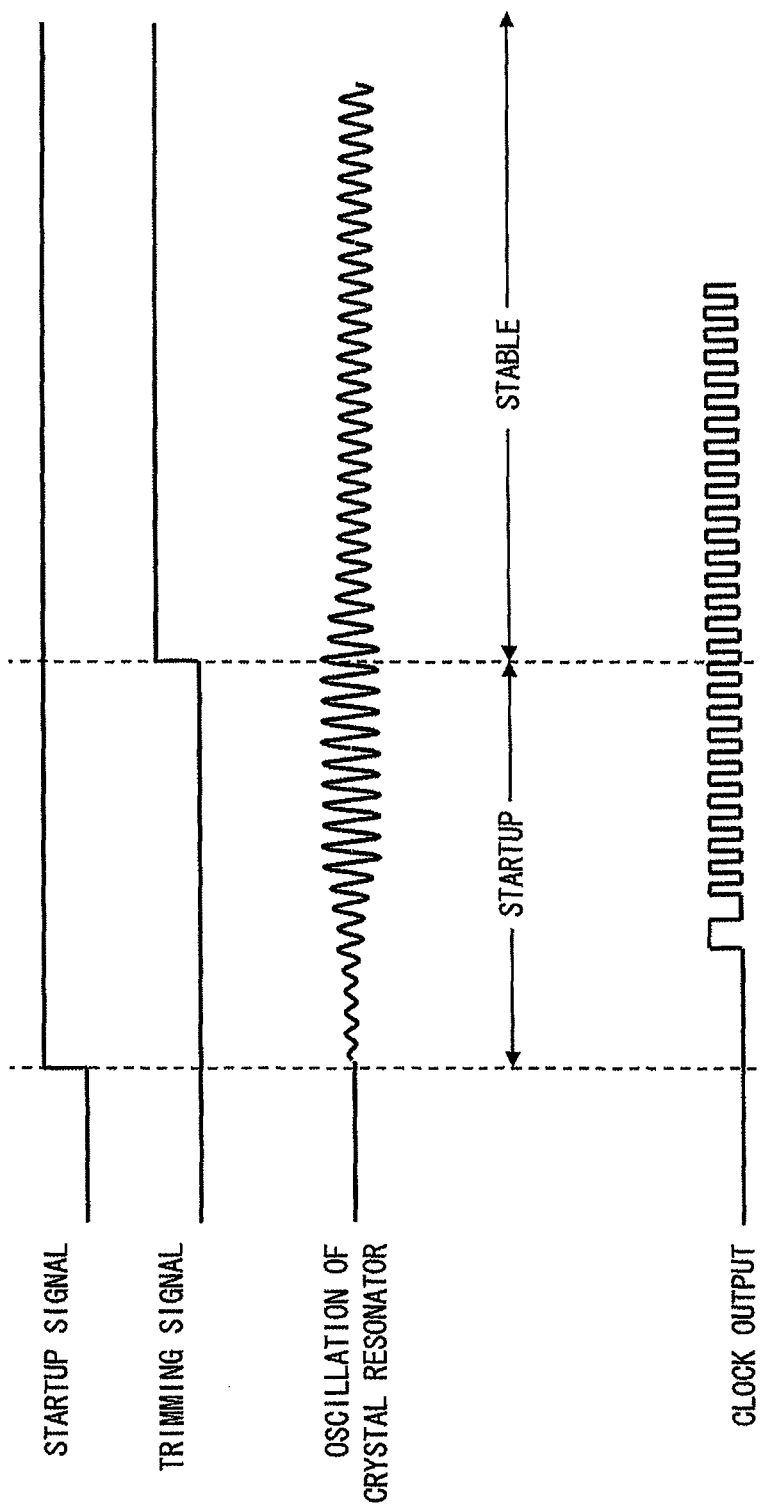
FIG. 21 is a timing chart showing an operation of the signal processing system according to the third embodiment.
Figure 22:
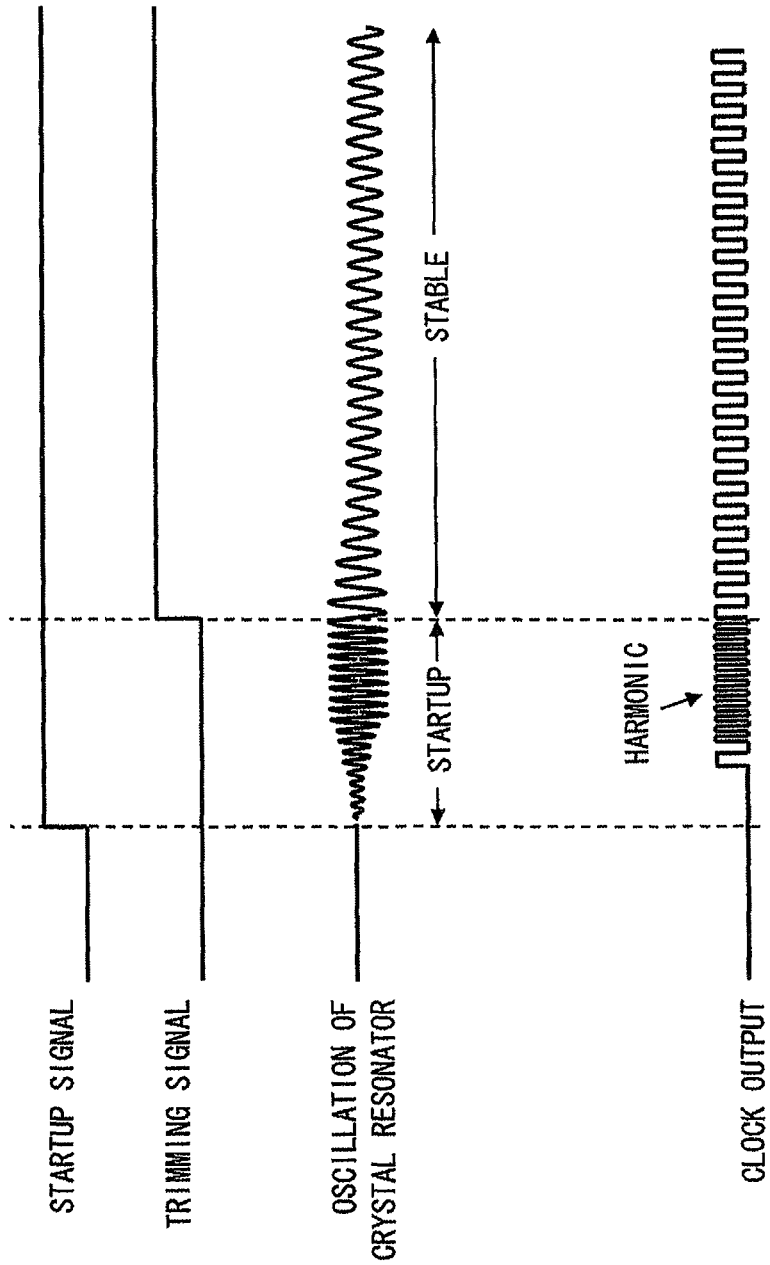
FIG. 22 is a timing chart showing an operation of the signal processing system according to the third embodiment.

FIG. 21 is a timing chart showing an operation of the signal processing system 100 when the oscillation signal having the predetermined frequency is generated at the time of startup. FIG. 22 is a timing chart showing an operation of the signal processing system 100 when a harmonic oscillation signal is generated at the time of startup.

As shown in FIG. 21, when an oscillation signal having a predetermined frequency is generated at the time of startup, the system controller 101 synchronizes with a clock signal CLK having a predetermined frequency and activates a trimming signal. When the trimming signal is activated, the register 102 outputs the mode set information to the oscillation circuit 1. Then, the oscillation circuit 1 continues to generate an oscillation signal having a predetermined frequency.

Further, as shown in FIG. 22, when the harmonic oscillation signal is generated at the time of startup, the system controller 101 synchronizes with the harmonic clock signal and activates the trimming signal. When the trimming signal is activated, the register 102 outputs the mode set information to the oscillation circuit 1. In this manner, the oscillation circuit 1 can generate the oscillation signal having the predetermined frequency.

As described so far, even when the oscillation circuit generates a harmonic oscillation signal at the time of startup, the signal processing system 100 of this embodiment can stably operate the oscillation circuit after that.

In this embodiment, although an example is explained in which the oscillation circuit 1 is incorporated in the signal processing system 100, it is not limited thereto. Either of the oscillation circuits according to the first or second embodiment, or a common oscillation circuit that is capable of changing a capacitance value of a load capacitance and a gain of an inverting amplifier may be incorporated in the signal processing system 100.

Although the invention made by the inventors has been explained in detail based on the embodiments, the present invention is not limited to the above-explained embodiments, and it is obvious that various modifications can be made without departing from the scope of the invention.

For example, in the above embodiments, the conductive types (p or n type) of the semiconductor board, the semiconductor layer, and the diffusion layer (diffusion region) may be reversed. Therefore, when one of the conductive types, which are n and p type, is regarded as the first conductive type and the other conductive type is regarded as the second conductive type, the first conductive type may be p type and the second conductive type may be n type. On the contrary, the first conductive type may be n type and the second conductive type may be p type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
   first and second external terminals that are connected to respective ends of a piezoelectric vibrator, the piezoelectric vibrator being externally disposed;
   an inverting amplifier that is disposed between the first and second external terminals;
   a feedback resistance that feeds back an output of the inverting amplifier to an input of the inverting amplifier;
   a first capacitative element that is disposed between the first external terminal and a reference voltage terminal;
   a first resistive element that is disposed in series with the first capacitative element;
   a second capacitative element that is disposed between the second external terminal and the reference voltage terminal;
   a second resistive element that is disposed in series with the second capacitative element;
   a first switch that is disposed in series with the first capacitative element and the first resistive element;
   a second switch that is disposed in series with the second capacitative element and the second resistive element;
   a third capacitative element that is disposed between the first external terminal and the reference voltage terminal;
   a third resistive element and a third switch that are disposed in series with the third capacitative element;
   a fourth capacitative element that is disposed between the second external terminal and the reference voltage terminal; and
   a fourth resistive element and a fourth switch that are disposed in series with the fourth capacitative element,
   wherein each of the first to fourth switches are MOS transistors, and
   wherein each of the first to fourth resistive elements is respectively a silicide block region in the first to fourth switches.

2. The semiconductor apparatus according to claim 1, wherein each of the first and second capacitative elements is a variable capacitative element.

3. The semiconductor apparatus according to claim 1, further comprising:
   a first variable capacitative element that is disposed in parallel with the first capacitative element and the first resistive element; and
   a second variable capacitative element that is disposed in parallel with the second capacitative element and the second resistive element.

4. The semiconductor apparatus according to claim 1, wherein each of the first to fourth switches is switched from off to on at a timing earlier than a timing when each of the first to fourth switches is switched from on to off.

5. The semiconductor apparatus according to claim 1, wherein each of the first to fourth resistive elements is respectively a silicide block region in which a silicide layer is not formed above a surface of a diffusion layer in the first to fourth switches.

6. The semiconductor apparatus according to claim 1, wherein the inverting amplifier is a variable gain amplifier that is capable of changing a gain.

7. The semiconductor apparatus according to claim 6, wherein the inverting amplifier comprises:
a plurality of inverting amplification circuits that are connected in parallel with each other; and
a plurality of gain switches that are connected in series with the respective inverting amplification circuits.

8. The semiconductor apparatus according to claim 7, wherein at least one of the plurality of gain switches is switched on.

9. An oscillation circuit comprising:
a semiconductor apparatus; and
a piezoelectric vibrator that is disposed external to the semiconductor apparatus,
wherein the semiconductor apparatus includes:
first and second external terminals that are connected to respective ends of the piezoelectric vibrator;
an inverting amplifier that is disposed between the first and second external terminals;
a feedback resistance that feeds back an output of the inverting amplifier to an input of the inverting amplifier;
a first capacitative element that is disposed between the first external terminal and a reference voltage terminal;
a first resistive element that is disposed in series with the first capacitative element;
a second capacitative element that is disposed between the second external terminal and the reference voltage terminal;
a second resistive element that is disposed in series with the second capacitative element;
a first switch that is disposed in series with the first capacitative element and the first resistive element;
a second switch that is disposed in series with the second capacitative element and the second resistive element;
a third capacitative element that is disposed between the first external terminal and the reference voltage terminal;
a third resistive element and a third switch that are disposed in series with the third capacitative element;
a fourth capacitative element that is disposed between the second external terminal and the reference voltage terminal; and
a fourth resistive element and a fourth switch that are disposed in series with the fourth capacitative element,
wherein each of the first to fourth switches are MOS transistors, and
wherein each of the first to fourth resistive elements is respectively a silicide block region in the first to fourth switches.

10. The oscillation circuit according to claim 9, wherein each of the first and second capacitative elements is a variable capacitative element.

11. The oscillation circuit according to claim 9, wherein the semiconductor apparatus further includes:
a first variable capacitative element that is disposed in parallel with the first capacitative element and the first resistive element; and
a second variable capacitative element that is disposed in parallel with the second capacitative element and the second resistive element.

12. The oscillation circuit according to claim 9, wherein each of the first to fourth switches is switched from off to on at a timing earlier than a timing when each of the first to fourth switches is switched from on to off.

13. The oscillation circuit according to claim 9, wherein each of the first to fourth resistive elements is respectively the silicide block region in which a silicide layer is not formed above a surface of a diffusion layer in the first to fourth switches.

14. The oscillation circuit according to claim 9, wherein the inverting amplifier is a variable gain amplifier that is capable of changing a gain.

15. The oscillation circuit according to claim 14, wherein the inverting amplifier comprises:
a plurality of inverting amplification circuits that are connected in parallel with each other; and
a plurality of gain switches that are connected in series with the respective inverting amplification circuits.

16. The oscillation circuit according to claim 15, wherein at least one of the plurality of gain switches is switched on.

17. A signal processing system comprising:
an oscillation circuit that comprises:
a semiconductor apparatus; and
a piezoelectric vibrator that is disposed external to the semiconductor apparatus,
where the semiconductor apparatus includes:
first and second external terminals that are connected to respective ends of the piezoelectric vibrator;
an inverting amplifier that is disposed between the first and second external terminals;
a feedback resistance that feeds back an output of the inverting amplifier to an input of the inverting amplifier;
a first capacitative element that is disposed between the first external terminal and a reference voltage terminal;
a first resistive element that is disposed in series with the first capacitative element;
a second capacitative element that is disposed between the second external terminal and the reference voltage terminal;
a second resistive element that is disposed in series with the second capacitative element;
a first switch that is disposed in series with the first capacitative element and the first resistive element;
a second switch that is disposed in series with the second capacitative element and the second resistive element;
a third capacitative element that is disposed between the first external terminal and the reference voltage terminal;
a third resistive element and a third switch that are disposed in series with the third capacitative element;
a fourth capacitative element that is disposed between the second external terminal and the reference voltage terminal; and
a fourth resistive element and a fourth switch that are disposed in series with the fourth capacitative element;
a register that stores on/off switch information of the first to fourth switches that are disposed in the oscillation circuit; and a control unit that outputs the on/off switch information that is stored to the register to the oscillation circuit according to a harmonic oscillation signal output from the oscillation circuit, wherein each of the first to fourth switches are MOS transistors, and wherein each of the first to fourth resistive elements is respectively a silicide block region in the first to fourth switches.

18. The signal processing system of claim 17, wherein each of the first to fourth resistive elements is respectively the silicide block region in which a silicide layer is not formed above a surface of a diffusion layer in the first to fourth switches.

19. The signal processing system of claim 17, wherein the inverting amplifier is a variable gain amplifier that is capable of changing a gain, wherein the inverting amplifier comprises:
- a plurality of inverting amplification circuits that are connected in parallel with each other; and
- a plurality of gain switches that are connected in series with the respective inverting amplification circuits, and wherein at least one of the plurality of gain switches is switched on.

* * * * *